(12) United States Patent
Fukuda et al.

(10) Patent No.: US 7,385,450 B2
(45) Date of Patent: Jun. 10, 2008

(54) BIAS CIRCUIT

(75) Inventors: Atsushi Fukuda, Yokohama (JP);
Hiroshi Okazaki, Yokosuka (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 128 days.

(21) Appl. No.: 11/370,863

(22) Filed: Mar. 9, 2006

(65) Prior Publication Data

US 2006/0202764 A1     Sep. 14, 2006

(30) Foreign Application Priority Data

Mar. 14, 2005  (JP)  ............................ 2005-071922

(51) Int. Cl.
*H03F 3/04* (2006.01)
(52) U.S. Cl. ................................... 330/296
(58) Field of Classification Search .............. 330/296
See application file for complete search history.

(56) References Cited

U.S. PATENT DOCUMENTS

| 4,031,488 A | 6/1977 | Beno ........................ 333/21 A |
| 4,267,538 A | 5/1981 | Assal et al. ................. 333/262 |
| 5,815,038 A | 9/1998 | Ogura et al. ............... 330/149 |
| 6,011,446 A | 1/2000 | Woods ........................ 331/185 |
| 6,140,892 A | 10/2000 | Uda et al. ................... 333/204 |
| 6,259,332 B1 | 7/2001 | Hosoya ........................ 331/96 |
| 6,956,437 B2 * | 10/2005 | Lopez et al. ................ 330/296 |
| 2006/0202764 A1 | 9/2006 | Fukuda et al. | |

FOREIGN PATENT DOCUMENTS

| EP | 0 556 398 A1 | 8/1993 |
| EP | 0 683 562 A1 | 11/1995 |
| JP | 61-99402 | 5/1986 |
| JP | 8-274552 | 10/1996 |
| JP | 11-41042 | 2/1999 |
| JP | 11-150431 | 6/1999 |
| JP | 2001-136035 | 5/2001 |
| JP | 2001-267864 | 9/2001 |
| JP | 2003-101440 | 4/2003 |
| JP | 2004-80826 | 3/2004 |

OTHER PUBLICATIONS

U.S. Appl. No. 11/555,437, filed Nov. 1, 2006, Kawai et al.

\* cited by examiner

*Primary Examiner*—Steven J. Mottola
(74) *Attorney, Agent, or Firm*—Oblon, Spivak, McClelland, Maier & Neustadt, P.C.

(57) ABSTRACT

The present invention has for its object to provide a bias circuit capable of handling multiple frequency bands, which has a low number of parts and can be miniaturized. As a solving means therefor, the bias circuit of the present invention comprises: a first reactance means 2 and a second reactance means 5, one end each of which is connected to a bias point 210 to which an alternating current signal is supplied; a capacitive means 3 connecting the other end of first reactance means 2; and a direct-current circuit 4 supplying a direct-current bias signal to the connection point of first reactance means 2 and capacitive means 3. Then, the reactance values of first and second reactance means 2, 5 have been set so as to make the combined admittance, seen from the alternating current signal supply point toward the side of first reactance element 2 and second reactance element 5, zero.

13 Claims, 17 Drawing Sheets

$S_{11}$ REFLECTION FACTOR
$S_{21}$ FORWARD TRANSFER FACTOR
$S_{22}$ OUTPUT SIDE REFLECTION FACTOR
$S_{12}$ REVERSE TRANSFER FACTOR

OPERATION AT 2 GHz
(SW OFF)

OPERATION AT 1 GHz
(SW ON)

BIAS CIRCUIT

BACKGROUND OF THE INVENTION

1. Field of the Invention

This invention pertains to a bias circuit utilized in power amplifiers and the like for radio equipment operating in e.g. the quasi-microwave or microwave frequency band.

2. Description of Related Art

In recent years, accompanying the diversification of services offered by means of radio communications, conversion to multiband capability enabling the processing information in a plurality of frequency bands has come to be demanded of radio equipment. Together with converting radio equipment to multiband capability, the increase in the circuit size of bias circuits of power amplifiers has become a problem.

In FIG. 1, an example of a bias circuit of the power amplifier of a conventional piece of radio equipment is shown. To the gate electrode of a Field Effect Transistor 180 (below referred to as an FET), an active element carrying out power amplification, there is connected a transmission line 181 with a wavelength equal to a quarter of the wavelength λ of the used frequency, the other end of which is connected to ground via a capacitor 182. The connection point of transmission line 181 and capacitor 182 is connected to one end of a choke coil 183, the other end of choke coil 183 being connected to a DC power supply 184 generating a fixed DC voltage with respect to the ground potential.

In case capacitor 182 has a capacitance (a sufficiently high capacitance) with an impedance which becomes sufficiently small at the frequency of a transmitted signal with a wavelength λ, transmission line 181 operates as a line whose tip is short-circuited. At this point, the impedance with respect to a transmitted signal from the gate electrode of FET 180 to DC power supply 184 can be considered to be infinite. Also, the voltage of DC power supply 184 is impressed on the gate voltage of FET 180 through choke coil 183 and transmission line 181. As a result, FET 180 operates with the DC voltage of DC power supply 184 taken as a bias voltage. A bias circuit of this kind is shown in Paragraph 0005 and FIG. 6 of Japanese Patent Application Laid Open No. 11 (1999)-150431 (hereinafter referred to as Document 1).

This conventional bias circuit has had the problem that a large value had to be set for the electrostatic capacitance of capacitor 182 due to the necessity of connecting one end of transmission line 181 to AC ground. In addition, there has also been the necessity of setting a large value for the impedance of choke coil 183 in order to block AC signals communicated to DC power supply 184.

In the conventional bias circuit shown in FIG. 1 as well, by taking a line length other than a quarter of the wavelength λ of the used wavelength for transmission line 181 and considering it as a reactance element, as well as by reducing the electrostatic capacitance value of capacitor 182, it has become possible to design the combined impedance of the reactance value thereof and capacitor 182 to be infinite and to aggressively miniaturize the bias circuit.

However, since capacitor 182 normally has a random variation of 5 to 10%, there has been no means of regulating the frequency characteristics fluctuations of the bias circuit due to the random variation, so the circuit could not actually be used in mass-produced articles. In other words, the conventional bias circuit determined the operation frequency by means of a quarter-wavelength transmission line 181 which could be formed by a geometric technique having very small random variation. The capacitor 182 at that time was for AC connection to ground, and it was acceptable for the value of the electrostatic capacitance to exceed a certain value, so random variation could be disregarded.

Also, in case a conversion to multiband capability is carried out in accordance with FIG. 1, there is a need to attain the reactance of the first reactance means with a variable-reactance element, but it is assumed that a large electric currents flow in the first reactance means, so it is difficult to realize a variable-reactance element which is able to cope with large currents of that kind.

A method of using a plurality of these conventional bias circuits to respond to multiple bands is disclosed in line 4 of Paragraph 0005 and FIG. 1 of Japanese Patent Application Laid Open No. 2003-101440 (hereinafter referred to as Document 2). In the case of conversion to multiband capability, a further problem arises due to the need to use several of the aforementioned large-sized elements.

As another method of conversion to multiband capability, the method of changing the input and output impedances of the amplifier to change the matching conditions to respond to the conversion to multiband capability by varying the bias voltage of an active element is disclosed in Paragraph 0028 and FIG. 1 of Japanese Patent Application Laid Open No. 2001-267864 (hereinafter referred to as Document 3). As mentioned in lines 4 to 6 of Paragraph 0028 of Document 3, this method also assumes that a plurality of bias circuits are prepared in advance, so it has the same problem.

The problems of the aforementioned conventional technologies are summarized as follows. In the conventional bias circuit, there has been the problem that large-sized elements had to be used, so the bias circuit ended up becoming large. Also, in the conventional bias circuit, if miniaturization was attempted, there was no means of regulating frequency characteristics fluctuations due to random variation in the elements. Moreover, in the case of conversion to multiband capability, there is a need to realize the reactance of the first reactance means with a variable-reactance element, but a large electric current is assumed to flow in the first reactance means, so it is difficult to realize a variable-reactance element capable of handling large electric currents of that kind.

The present invention has been made to take these points into consideration and has for its object to provide a bias circuit which is constituted by miniature components and capable of regulating frequency characteristics fluctuations due random variation in components. Moreover, it is an object of the present invention to provide a bias circuit which can be miniaturized when converting to multiband capability.

SUMMARY OF THE INVENTION

One end of a first reactance means is connected to a terminal to which an AC signal is supplied, the other end of the first reactance means being connected to ground via a capacitive means. A DC circuit generating a certain DC voltage which is fixed with respect to ground is connected to the connection point of the first reactance means and the capacitive means. One end of a second reactance means is connected to the terminal to which the AC signal is supplied. The connection point of this first reactance means and this second reactance means is connected to the control terminal of an active element performing power amplification such as the gate electrode of e.g. an FET. Also, each reactance value of the first reactance means, the second reactance means and the capacitive means is set so that, at the frequency of the supplied AC signal, the total admittance seen toward the side of the first reactance means and the second reactance means becomes zero.

As mentioned above, the DC circuit supplying the bias voltage is connected to the point at which the AC signal is supplied in such a way that the impedance becomes infinite at the frequency of the AC signal source. Consequently, it is possible to supply an AC signal to the control terminal of the active element or the like performing power amplification without being subject to the influence of the bias circuit impressing the bias voltage.

Since the total admittance seen from the AC signal supply point toward the side of the first reactance means and the second reactance means is regulated to be zero, the operation of the capacitive means connected to the first reactance means differs from that of the conventional bias circuit in that there is no need for a large electrostatic capacitance value having an AC ground as the object, so the inventive circuit can be reduced in size.

In the case of conversion to multiband capability, since the first reactance means and the second reactance means are regulated so that the combined admittance seen from the AC signal supply points toward the side of the first reactance means and the second reactance means becomes zero for each of a plurality of AC signal frequencies, it is possible to realize a bias circuit which can be applied to a plurality of AC signal frequencies. Also, since it is not necessary to respectively provide a plurality of bias circuits handling the various AC signal frequencies, it is possible to substantially reduce the size increase in the scale of the circuits when converting to multiband capability.

And then, by making the reactance value of the second reactance means variable, the random variation in the frequencies making the sum of the admittances zero can be regulated. Also, when it comes to a method of making the second reactance means variable, it is also possible to use a variable capacitor or the like through which a direct current does not pass. Consequently, even in the case where the electric current of the DC signal is large, it is possible to readily make the reactance value of the second reactance means variable.

DETAILED DESCRIPTION OF THE PREFERRED EMBODIMENTS

First Embodiment

Figure 2:
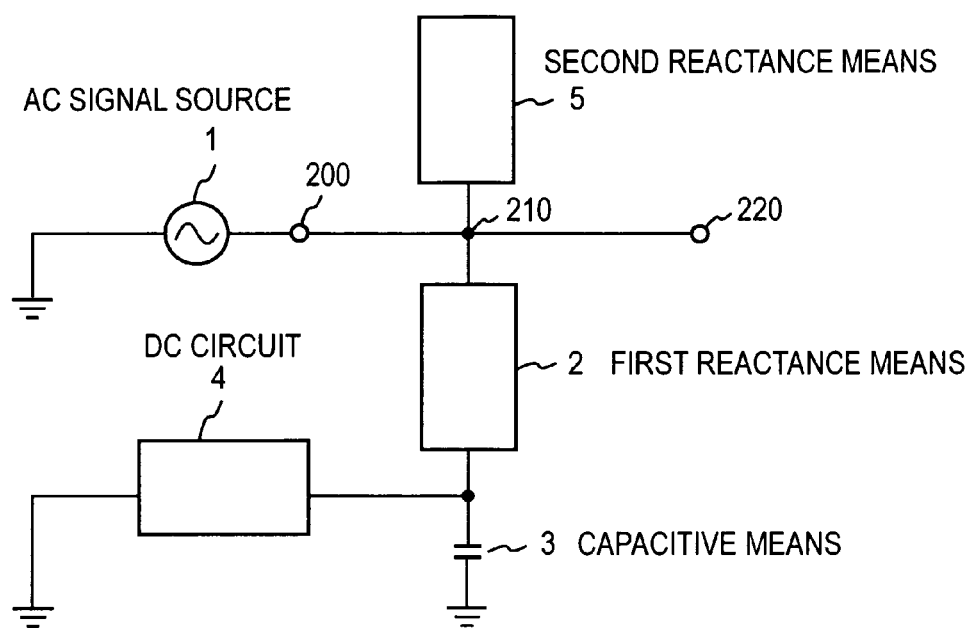
FIG. 2 is a diagram showing the first embodiment of this invention.

FIG. 2 is a diagram showing the first embodiment of this invention. One end of a first reactance means 2 is connected to an AC signal supply point 200 at which an AC signal is supplied from an AC signal source 1. The other end of first reactance means 2 is connected to ground via a capacitive means 3. A DC circuit 4 generating a certain fixed DC voltage with respect to ground is connected to the connection point of first reactance means 2 and capacitive means 3. One end of a second reactance means 5 is connected to AC signal supply point 200 at which an AC signal is supplied.

A connection point 210 of first reactance means 2 and second reactance means 5 is connected, via a terminal 220, to the control terminal of an active element performing power amplification such as the gate electrode of e.g. an FET. Below, connection point 210 will be referred to as a bias point.

If the admittance of first reactive means 2 is taken to be $Y_1$, the admittance of second reactance means 5 is taken to be $Y_2$, and the admittance of capacitive means 3 is taken to be $Y_c$, and if each admittance $Y_1$, $Y_2$, $Y_c$ is set so that the formula of the sum of the admittances seen from AC signal supply point 200 in the direction of first reactive means 2 and second reactive means 5, becomes zero, $$Y_1 + (Y_2 + Y_c) = 0, \qquad (1)$$

the combined impedance seen from AC signal source 1 becomes infinite. At this point, DC circuit 4, which is connected via first reactance means 2 to bias point 210, is cut off AC-wise. DC circuit 4 may e.g. be one in which transmission lines of a conductive material such as gold (Au) are formed on a dielectric board of alumina or the like. Since, in this case, the connections are carried out with the resistivity of the conductive material forming the lines, it is possible to supply a DC voltage at the bias point with a very low resistance value.

Taking the frequency of the AC signal supplied at AC signal supply point 200 to be 2 GHz, and if an example is designed wherein first reactance means 2 and second reactance means 5 in FIG. 2 are constituted by transmission lines, the delay due to the first reactance means 2 transmission line becomes 30°, the delay due to the second reactance means 5 transmission line becomes 70°, the electrostatic capacitance of capacitive means 3 becomes 10 pF, and the inductance of choke coil inside DC circuit 4 becomes 10 nH.

The total delay due to first reactance means 2 and second reactance means 5 is 100° which is not very different from the conventional line length of a quarter of the wavelength $\lambda$ and shown in FIG. 1, the wavelength $\lambda_{2G}/4$ (hereinafter, line lengths will be expressed as a fraction of a $\lambda$ with a subscript indicating the frequency).

On the other hand, attention should be paid to the point that, with a value of 10 pF, the electrostatic capacitance of capacitive means 3 is small. Regarding the electrostatic capacitance value of capacitor 182, a component with the object of connecting transmission line 181 to AC ground, in the conventional bias circuit shown in FIG. 1, there was a need to choose an electrostatic capacitance value at least 10 times greater than that of capacitive means 3 in accordance with this invention.

In the bias circuit of this invention, shown in FIG. 2, since it is possible to reduce the reactance value of the capacitive means, the whole bias circuit can be miniaturized. Next, there is shown a specific example illustrating to which extent miniaturization is possible.

As miniature capacitors used in high-frequency circuits, there are known thin-film chip capacitors for high frequencies. In case the capacitance thereof is on the order of 100 pF, the size becomes large for a chip capacitor, with a length of 3.2 mm and a width of 1.6 mm (commonly known by the name "3216"). As against that, in the case of a capacitance of 10 pF or less, the size is reduced, to a length of 0.6 mm and a width of 0.3 mm (commonly known by the name "0603"). In this case, it is possible to use an ultra-small chip capacitor. Consequently, the bias circuit can be miniaturized.

Figure 3:
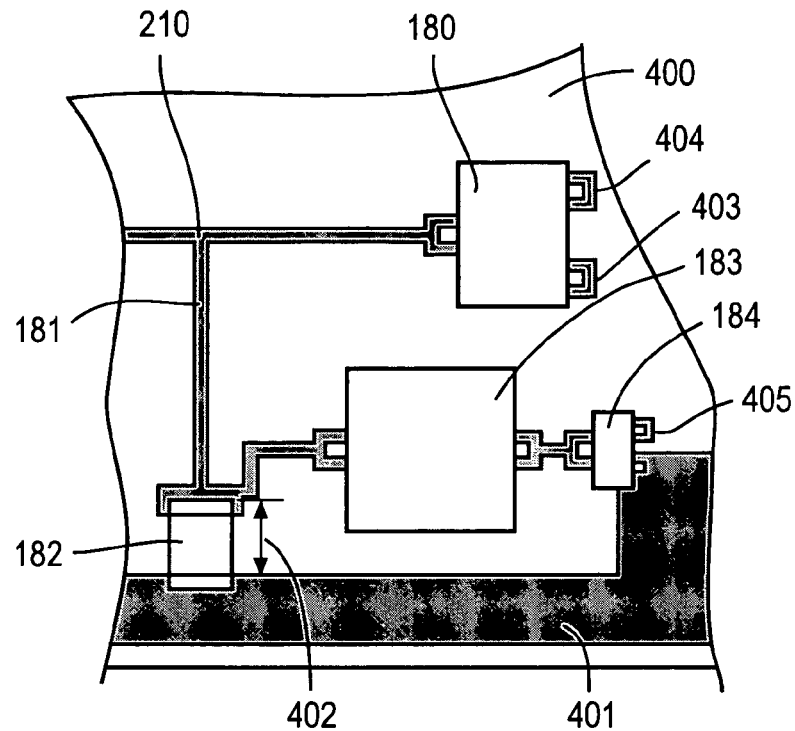
FIG. 3 is a diagram showing an example of a component layout in which a conventional bias circuit shown in FIG. 1 is installed on an RF board.
Figure 4:
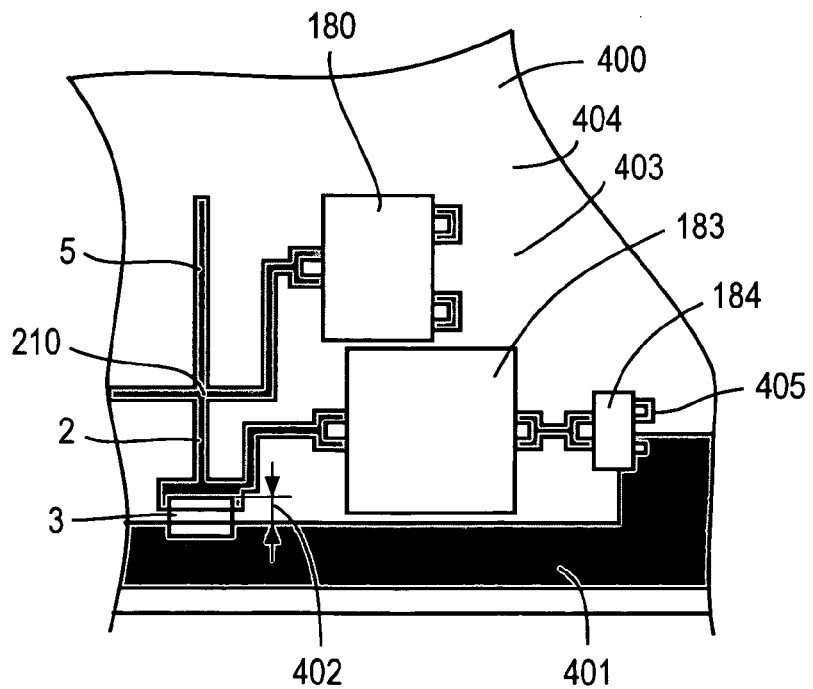
FIG. 4 is a diagram showing an example of a component layout in which a bias circuit of this invention is installed on an RF board.

In FIG. 3 and FIG. 4, there are shown plan views where only the bias circuit portion of the radio board (hereinafter referred to as an RF board) inside a communication terminal has been extracted. FIG. 3 shows the conventional bias circuit shown in FIG. 1. FIG. 4 is a diagram showing an example of a component layout in which a bias circuit of this invention has been installed on an RF board 400. FIG. 3 and FIG. 4 correspond respectively to FIG. 1 and FIG. 2, and the reference numerals are also identical. Since the connection relationships are also identical, a detailed description is omitted, and only the important points will be explained.

Transmission line 181, which consists of a wiring pattern with bias point 210 of FIG. 3 at one end, has the other end connected to one end of capacitor 182. The other end of capacitor 182 is connected to a ground pattern 401 at ground potential. The capacitance of capacitor 182 can e.g. be 100 pF and capacitor 182 has a size with a length of 3.2 mm and a width of 1.6 mm.

Consequently, in the component layout shown in FIG. 3, the spacing 402 between ground pattern 401 and the end of capacitor 182 on the side of transmission line 181 needs to be approximately 3 mm.

As against this, in this invention, as shown in FIG. 4, since the electrostatic capacitance of capacitive means 3 is 10 pF, it is possible to use an ultra-small chip capacitor with a length of 0.6 mm and a width of 0.3 mm, so the spacing 402 between ground pattern 401 and the end of capacitive means 3 on the side of first reactance means 2 works out to approximately 0.6 mm.

Next, an explanation will be given of the influence exerted on miniaturization by second reactance means 5 which is added in the present invention. First reactance element 2 is a transmission line with a line length of $\lambda_{2G}/12$, consisting of a wiring pattern generating a delay of 30°. This first reactance element 2 has one end connected to bias point 210, the other end being connected via capacitive means 3 to ground pattern 401 which is at ground potential. Also, second reactance means 5 is a transmission line with a line length of $7\lambda_{2G}/36$, consisting of a wiring pattern generating a delay of approximately 70°. This second reactance means 5 has one end connected to bias point 210, the other end being left open. AC-wise, there is a parallel relationship between first reactance means 2 and second reactance means 5.

Consequently, the total length of the transmission line combining first reactance means 2 and second reactance means 5 works out to $10\lambda_{2G}/36$, which is $\lambda_{2G}/36$ longer than a quarter of the wavelength. With a value of approximately 4.16 mm, $\lambda_{2G}/36$ is longer than the length of the capacitive means. However, since it is a transmission line, it is possible, by giving it a layout with a zigzag pattern (not illustrated), to choose the line length thereof to be the same as in FIG. 3 for a conventional bias circuit. And when the transmission line is formed on a substrate whose dielectric constant is 10, $\lambda_{2G}/36$ is approximately 1.32 mm. In this case, the problem of the length of the transmission line won't be occurred.

Further, in FIG. 3 and FIG. 4, a source electrode 403 and a drain electrode 404 of FET 180 as well as a positive power supply 405, of a three-terminal fixed-voltage IC 184 which is a DC power supply 184, are illustrated as if they are left open, but these terminals are connected to other, not illustrated electrodes by means of through holes inside RF board 400.

As described in this example, according to the bias circuit of this invention, it is possible to reduce the shape of capacitive means 3, a lumped-parameter element, and it is possible to shorten the RF board on the order of 3 mm, in the width or the length direction. A lumped-parameter element has a shape which is fixed, so component layout planning is more difficult than for distributed-parameter elements. Consequently, the miniaturization of lumped-parameter elements is effective for the miniaturization of the whole circuit.

Figure 1:
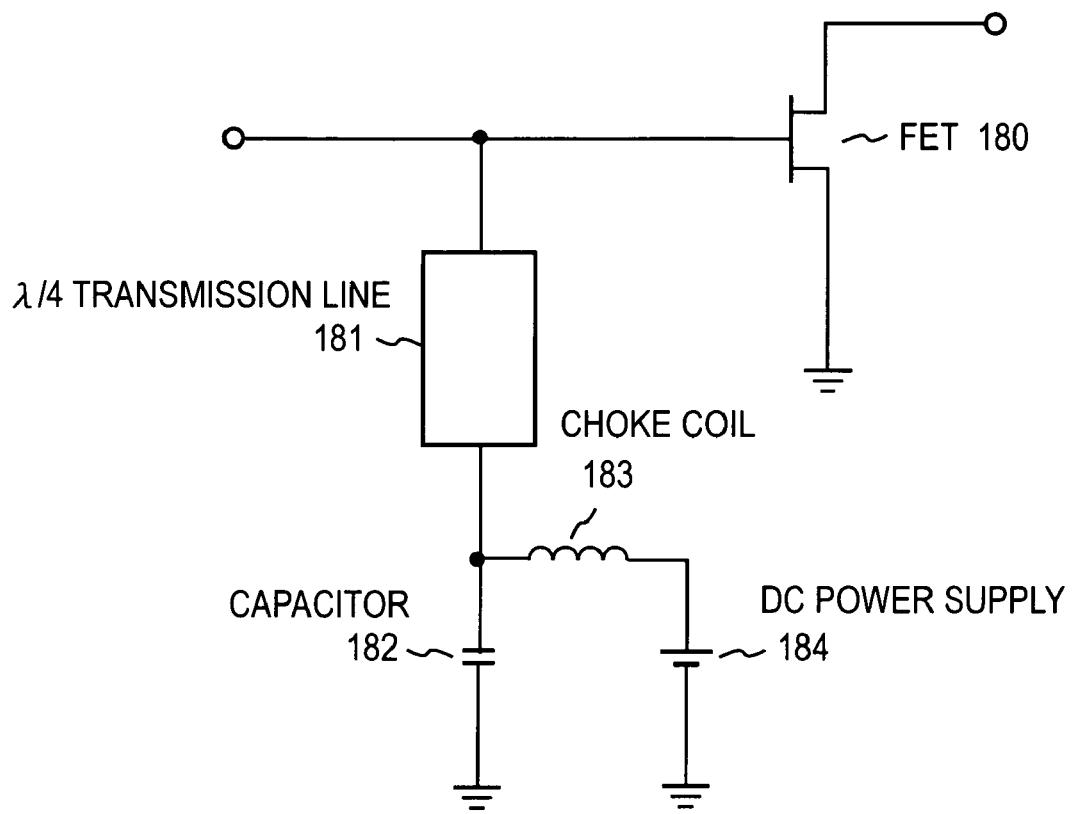
FIG. 1 is a diagram showing an example of a conventional bias circuit.

Further, even in the conventional bias circuit shown in FIG. 1, it is possible from the viewpoint of circuit configuration, with the object of simply miniaturizing, to reduce the electrostatic capacitance of capacitor 182 by taking the line length of transmission line 181 to have a line length other than $\lambda_H/4$ and choosing the combined impedance due to transmission line 181 and capacitor 182 to be infinite. However, in that case, there is no means of regulating the 5-to-10-percent error in electrostatic capacitance that a normal capacitor 182 has. Therefore, in the bias circuit shown in FIG. 1, a design making the combined impedance of transmission line 181 and capacitor 182 infinite can not be carried out practically.

As against that, in the bias circuit of this invention, shown in FIG. 2 and FIG. 4, the random variation of capacitive means 3 can be regulated by trimming, e.g. by means of laser irradiation, the open terminal of the $8\lambda_{2G}/36$ long transmission line, which is second reactance means 5.

Regarding the Conversion to Multiband Capability

In the aforementioned explanation, the electrostatic capacitance value of capacitive means 3 was reduced and a bias circuit handling one band was miniaturized. In the explanation below, capacitive means 3 is left with a large capacitance, transmission lines are used for first reactance means 2 and second reactance means 5, and by actively changing the length of the same transmission lines, it is possible to configure, with a small size, a bias circuit handling multiple bands.

Hereinafter, an explanation of the basic principles thereof will be explained.

Basic Principle 1

First reactance means 2 of FIG. 2 is taken to be transmission line L1 and second reactance means 5 is taken to be transmission line L2. If the electrostatic capacitance of capacitive means 3 is taken to have a value which is sufficiently large to consider it a short circuit AC-wise with respect to an AC signal at the used frequency, transmission line L1 can be considered a line whose tip is short-circuited. Moreover, transmission line L2 can be considered as a line whose tip is open-circuited.

Since the electrostatic capacitance of capacitive means 3 is large enough to be considered a short circuit when looking at it AC-wise, the admittances $Y_{1\ and\ Y2}$ at the used frequency $f_H$, seen from AC signal source 1 to respectively transmission line L1 and transmission line L2, can be expressed as $$Y_1 = 1/(j\ Z_0 \tan \beta_H L_1) \text{ and} \quad (2)$$

$$Y_2 = j(1/Z_0) \tan \beta_H L_2. \quad (3)$$

Here, $\beta_H$ is the wave propagation constant at the used frequency $f_H$. It is given by the relationship $$\beta_H = 2\pi/\lambda_H. \quad (4)$$

Also, $\lambda_H$ is the wavelength of the used frequency $f_H$ and $Z_0$ is the characteristic impedance of transmission lines L1 and L2.

If the condition that the sum of the admittances at the used frequency $f_H$ becomes zero is obtained from Eq. 2 and Eq. 3, the result is the condition shown in the following equation:

$$\beta_H L_1 + \beta_H L_2 = \frac{1}{2}(2n-1)\pi. \quad (5)$$

Here, n is a natural number. If this condition is satisfied, the admittance seen from AC signal source 1 toward transmission line L1 and transmission line L2 becomes zero. In other words, since the impedance becomes infinite, DC circuit 4, which is connected to bias point 210 via first reactance means 2, is cut off AC-wise. DC circuit 4 is connected to bias point 210 via transmission line L1 formed of a conductive material such as gold (Au) on a dielectric board of e.g. alumina or the like. Consequently, DC circuit 4 is connected to bias point 210 with the resistivity of the conductive material forming the line. Therefore, it is possible to supply a DC voltage to the bias point with a low resistance value.

When e.g. taking n and the line length of transmission line L1 in Eq. 5 to be respectively 1 and $\lambda_H/8$, the line length of transmission line L2 may be set to $\lambda_H/8$. By appropriately setting the lengths of transmission lines L1 and L2 in this way, it is possible to cut off DC circuit 4 AC-wise from bias point 210.

Basic Principle 2

Figure 5:
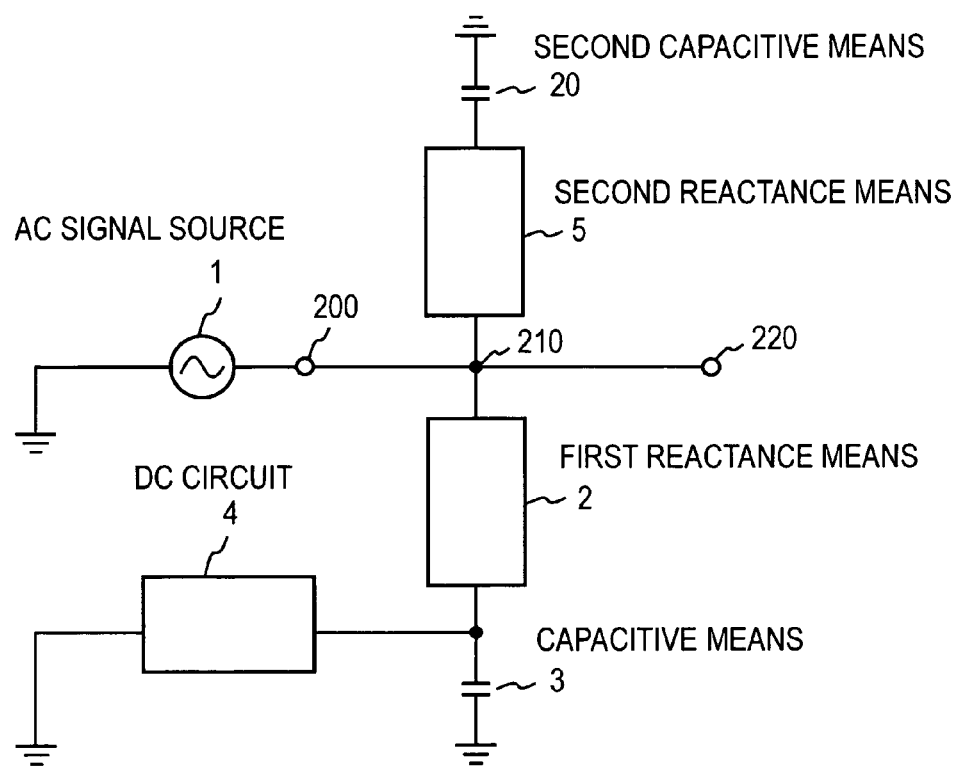
FIG. 5 is a diagram showing the other basic configuration example of this invention.

Another basic configuration example of this invention is explained with reference to FIG. 5. Second reactance means 5 shown in FIG. 2 is a line whose tip is open-circuited, but in the example of FIG. 5, the only point that differs is that the end of second reactance means 5 facing away from bias point 210 is connected to ground via a second capacitive means 20.

In the case of this example, by choosing the value of the electrostatic capacitance of second capacitive means 20 to be sufficiently large to consider it a short circuit AC-wise with respect to the AC signal of AC signal source 1, in the same way as capacitive means 3 shown in FIG. 2, the admittance $Y_2$ of second reactance means 5 is given by $$Y_2 = 1/(j\ Z_0 \tan \beta_H L_2), \quad (6)$$

which has the same form as that in Eq. 2.

As a result of this, if the condition that the sum of the admittances at the used frequency $f_H$ becomes zero is obtained from Eq. 2 and Eq. 6, the result is the condition shown in the following equation:

$$\beta_H L_1 + \beta_H L_2 = n\pi. \quad (7)$$

In this way, in case first reactance means 2 and second reactance means 5 are formed with lines whose tips are short-circuited, even for a harmonic of the design frequency, the condition that the admittance works out to zero is satisfied. Also, in the case, as in FIG. 2, that first reactance means 2 is taken to be a line whose tip is short-circuited and second reactance means 5 is taken to be a line whose tip is open-circuited, the condition that the admittance becomes zero for odd harmonics is fulfilled.

On the basis of the aforementioned basic principles, application examples of this invention will be explained hereinafter while making reference to the drawings.

Second Embodiment

Figure 6A:
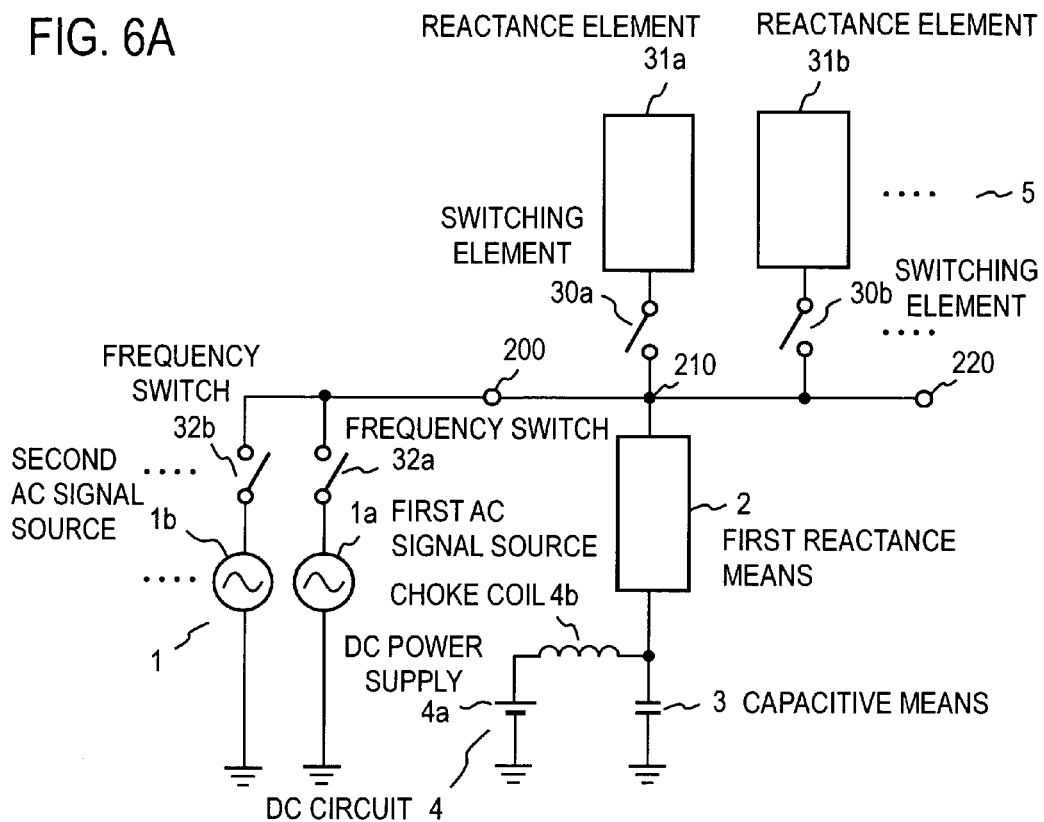
FIG. 6A is a diagram showing the second embodiment of this invention.

The second embodiment of this invention, shown in FIG. 6A, has a regulating means provided, which regulates the reactance value of second reactance means 5 in FIG. 2, with the object of handling multiple bands.

Second reactance means 5 of this embodiment is constituted so as to connect a plurality of reactance elements 31a, 31b, etc., with respective different values, to bias point 210, via a plurality of respective switching elements 30a, 30b, etc. Also, as a DC circuit 4, there is shown an example constituted by a DC power supply 4a taking the ground potential as reference and a choke coil 4b connected in series to the same DC power supply 4a. In order to make it easy to understand that the AC signal supplied to bias point 210 is a multiband plurality of frequency signals, there are shown a first AC signal source 1a, a second AC signal source 1b, etc., configured so as to be respectively connected via frequency switches 32a, 32b, etc., to AC signal supply point 200. E.g., the AC signal frequency of first AC signal source 1a is taken to be 4 GHz and the AC signal frequency of second AC signal source 1b is taken to be 3 GHz.

First, a state in which a 4 GHz AC signal is supplied to bias point 210 via frequency switch 32a will be considered.

At this point, switching element 30a, operating together with the AC signal frequency, is conductively connected, and reactance element 31a is connected to bias point 210. The control of the conductive connection and disconnection of switching elements 30a, 30b, etc., is not illustrated, but it can e.g. be performed by means of a control signal from a baseband IC (Integrated Circuit).

E.g., first reactance means 2 is formed with a transmission line, the line length thereof being taken to be set to $\lambda_{4G}/8$. If the line length of the reactance element 31a transmission line is set to a length of $\lambda_{4G}/8$, it is possible, from the relation in Eq. 5, to take $\beta_H L_1 + \beta_H L_2 = \pi/2$, so the sum of the combined admittances of first reactance means 2 and second reactance means 5 seen from first AC signal source 1a can be chosen to be zero.

Next, an attempt will be made to consider the case where the used frequency is 3 GHz. If one takes the lengths of the transmission lines to be unchanged, wavelength $\lambda_{3G}$ becomes 4/3 times longer in terms of the line length of first reactance means 2. Consequently, the line length at 3 GHz becomes relatively shorter and can be considered as $3\lambda_{3G}/32$ which is shorter by a factor of ¾. Similarly, the transmission line length of reactance element 31a constituting second reactance means 5 can also considered as $3\lambda_{3G}/32$. If this condition is substituted into Eq. 5, the right-hand side becomes $3\pi/8$, so the system ends up deviating from the condition that the admittance becomes zero.

Accordingly, there was chosen a configuration in which the reactance value of second reactance means 5 is changed in such a way that the condition in Eq. 4 that the admittance becomes zero is satisfied even for 3 GHz, and this is the configuration shown in FIG. 6A. In FIG. 6A, since the reactance value of first reactance means 2 is invariable, the term $\beta_H L_1$ at 3 GHz becomes $3\pi/16$, from $2\pi/\lambda_{3G} \times 3\lambda_{3G}/32$. Accordingly, in order for Eq. 5 to become $\pi/2$, it is necessary to change the reactance value of second reactance means 5. In this case, since, from $\pi/2 - \beta_H L_1$, $\beta_H L_2$ may be chosen to be $5\pi/16$, the line length of second reactance means 5 may be chosen to be $5\lambda_{3G}/32$. Consequently, the line length of second reactance means 5 may be extended $2\lambda_{3G}/32$. If this $\lambda_{3G}/16$ line length is converted to 4 GHz, it becomes $\lambda_{4G}/12$. In other words, by connecting reactance element 31b, which is a $5\lambda_{4G}/24$ transmission line L2 in which second reactance means 5, which had a line length of $\lambda_{4G}/8$, has been extended by a length of $\lambda_{4G}/12$, to bias point 210 by conductively connecting switching element 30b and taking switching element 30a to be non-conducting, it is possible to choose $\beta_H L_1 + \beta_H L_2 = \pi/2$.

Next, the case will be considered where the frequency is 2 GHz. In this case, transmission line L1, with a line length of $\lambda_{4G}/8$ and which forms first reactance means 2 with an invariable line length, can be considered to have half the length, $\lambda_{2G}/16$.

In order to make the admittance zero, since $\beta_H L_1 = \pi/8$, $\beta_H L_2 = \pi/2 - \pi/8 = 3\pi/8$. Consequently, the transmission line length of second reactance means 5 may be chosen to be $3\lambda_{2G}/16$. If a line length of $3\lambda_{2G}/16$ is converted to the frequency of 4 GHz, it becomes $6\lambda_{4G}/16$, i.e. $3\lambda_{4G}/8$. This is the line length of second reactance means 5, which had a line length of $\lambda_{4G}/8$, extended by a length of $\lambda_{4G}/4$. Adding the results of an investigation regarding the case where the frequency is 1 GHz, the aforementioned results are shown in Table 1.

TABLE 1

| | Frequency (GHz) | | | |
|---|---|---|---|---|
| | 4 | 3 | 2 | 1 |
| Transmission line L1 | $\lambda_{4G}/8$ | $3\lambda_{3G}/32$ | $2\lambda_{2G}/32$ | $\lambda_{1G}/32$ |
| Transmission line L2 | $\lambda_{4G}/8$ | $5\lambda_{3G}/32$ | $6\lambda_{2G}/32$ | $7\lambda_{1G}/32$ |
| $\beta_H L_1 + \beta_H L_2$ | $\pi/2$ | $\pi/2$ | $\pi/2$ | $\pi/2$ |
| Line length that should be added to transmission line L2 (converted to 4 GHz) | | $\lambda_{4G}/12$ | $\lambda_{4G}/4$ | $3\lambda_{4G}/4$ |
| Length of second reactance element (converted to 4 GHz) | $\lambda_{4G}/8$ | $5\lambda_{4G}/24$ | $3\lambda_{4G}/8$ | $7\lambda_{4G}/8$ |

In the case where the frequency is 1 GHz, by choosing a line length of $7\lambda_{4G}/8$, extended by a length of $3\lambda_{4G}/4$ from the $\lambda_{4G}/8$ line length of second reactance means 5, it is possible to make the sum of the admittances zero.

As mentioned above, in case the AC signal frequency drops, from a reference of 4 GHz, to 3, 2, or 1 GHz, the wavelength gets extended. Accordingly, by providing a second reactance means 5 handling the same frequencies, it is possible to implement a bias circuit in which DC circuit 4 is cut off, AC-wise.

In FIG. 6A, there were illustrated, as frequencies of an AC signal source, two types, but in Table 1, four frequency types are listed. Although not illustrated in FIG. 6A, if there are provided switching elements 30c, 30d connected at one end to bias point 210 and if there are provided, at the respective other ends of switching elements 30c, 30d, a reactance element 31c with a line length of $3\lambda_{4G}/8$ and a reactance element 31d with a line length of $7\lambda_{4G}/8$, neither of which is illustrated, it is possible to handle four frequencies.

As mentioned above, by providing a plurality of switching elements 30 and reactance elements 31 having, respectively, different reactance values with respect to the plurality of switching elements, it is possible to implement a bias circuit handling a plurality of AC signal frequencies.

Further, an explanation has been given for consecutively lowering the frequency of the AC signal supplied to bias point 210 from 4 GHz in 1-GHz steps, but even in the case of raising the frequency, the investigation method would be the same.

Also, in case first reactance means 2 and second reactance means 5 are constituted by transmission lines, the result, as is evident from Eq. 5, is the condition that the admittance becomes zero for every increment of $\pi$. In Table 1, an explanation was given with a configuration in which second reactance means 5 transmission line lengths are prepared individually with respect to each frequency, but for a frequency which is an odd multiple of the frequency taken as a reference, there comes into effect the condition that the admittance becomes zero with the same line length. E.g., if first reactance means 2 and second reactance means 5 are constituted by transmission lines, and if the length of each transmission line is set to the length $\lambda_{1G}/8$ for the frequency 1 GHz, the condition of Eq. 5 comes into effect at the odd-multiple frequencies 3, 5, 7, 9 GHz, etc. This kind of characteristic can be obtained if first and second reactance means 2, 5 are constituted by transmission lines, which are distributed-parameter circuit elements.

Third Embodiment

Figure 6B:
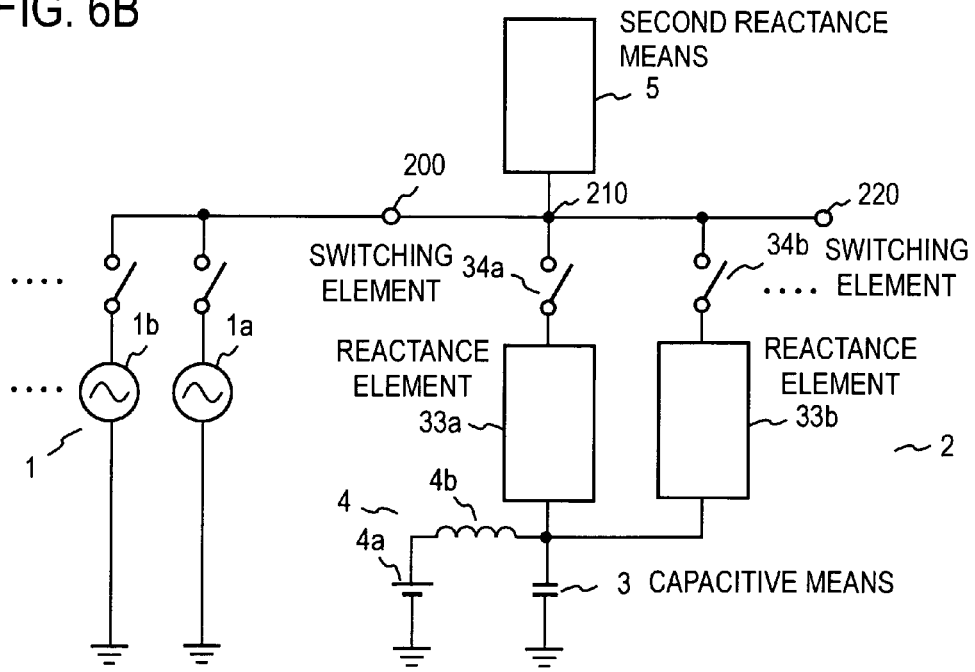
FIG. 6B is a diagram showing the third embodiment of this invention.

The embodiment shown in FIG. 6B is an example in which, contrary to FIG. 6A, first reactance means 2 is constituted by a plurality of reactance elements and switching elements. FIG. 6B is an example where first reactance means 2 of FIG. 2 is constituted by a plurality of reactance elements 33a, 33b, etc., and switching elements 34a, 34b connecting the same individually to bias point 210. The rest of the configuration is the same as in FIG. 6A.

In the present embodiment, the only difference from the second embodiment is a point devised to switch first reactance means 2. In the present embodiment, when the AC signal frequency of AC signal source 1 is modified, by a switching of switching elements 34a, 34b, etc., reactance elements 33a, 33b, etc., may be modified. In other words, even in the case of FIG. 6B, when the AC signal frequency changes from 4 GHz to 3 GHz, the line length of reactance element 33b connected via switching element 34b to bias point 210 may be made longer than reactance element 33a by just the length $\lambda_{4G}/12$. The relationship of Table 1 listed above is the same as for the second embodiment, so in the present embodiment, the line length of reactance elements 33 on the side of first reactance means 2 may be modified.

Fourth Embodiment

Figure 7:
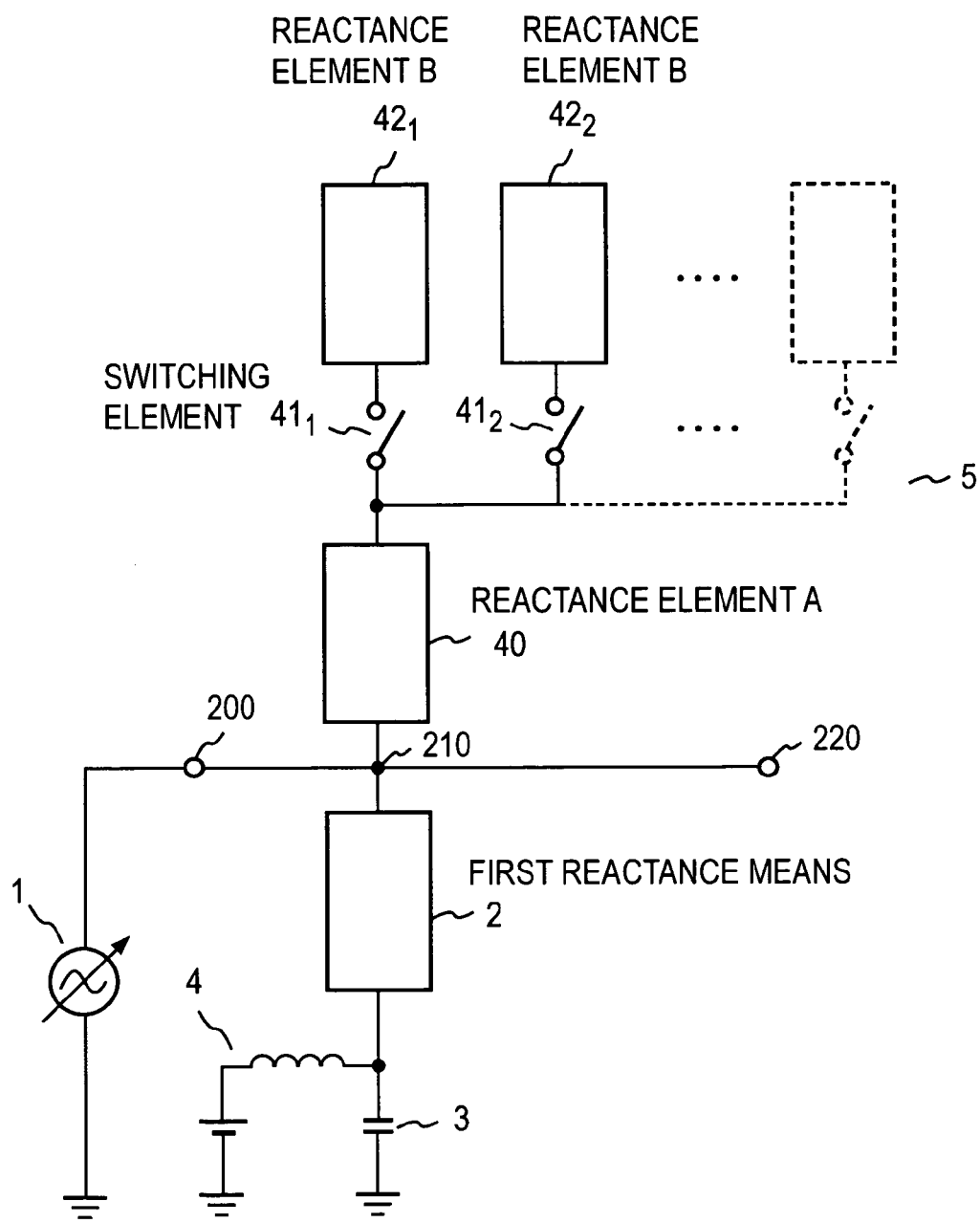
FIG. 7 is a diagram showing the fourth embodiment of this invention.

In FIG. 7, the configuration of the fourth embodiment is shown. This embodiment is one where, as second reactance means 5, there are selectively connected, in series to bias point 210, a reactance element A 40 and, with respect to the same, one of a plurality of reactance elements B $42_1$, $42_2$, etc., with mutually differing lengths.

In FIG. 6A, a number of reactance elements 31a, 31b, etc., corresponding to the number of AC signal frequencies of AC signal source 1 as well as switching elements 30a, 30b, etc., for connecting the same reactance elements selectively to bias point 210, were required. E.g., in case the frequencies were taken to be 1 GHz, 2 GHz, 3 GHz, and 4 GHz, an example was shown in which conversion to multiband capability was carried out by using four types of transmission lines L2, $7\lambda_{4G}/8$, $3\lambda_{4G}/8$, $5\lambda_{4G}/24$, and $\lambda_{4G}/8$. (Refer to Table 1.)

In the present embodiment, a reactance element A 40, being one part of second reactance means 5 which is always connected to bias point 210, is taken to be a transmission line having a line length $\lambda_{4G}/8$ corresponding to 4 GHz. And then, in order to handle a frequency of 3 GHz, the line length difference is prepared as reactance element B $42_1$. In order to handle 3 GHz, a line length of $5\lambda_{4G}/24$ is required as the line length of second reactance means 5. Consequently, reactance element B $42_1$ is calculated as $5\lambda_{4G}/24-\lambda_{4G}/8$, the result being a transmission with a line length of $\lambda_{4G}/12$.

When the AC signal frequency of AC signal source 1 is 4 GHz, switching elements $42_1$, $42_2$, etc., are all non-conducting, and only reactance element A40, with a line length of $\lambda_{1G}/8$, functions as second reactance means 5.

When the frequency is 3 GHz, switching element $41_1$ is conductively connected and for the line length of transmission line L2, which serves as second reactance means 5, $\lambda_{4G}/12$ is added to $\lambda_{4G}/8$, the result being $5\lambda_{4G}/24$. This line length is the length which makes the sum of the admittances zero when the frequency is 3 GHz. From an explanation referring to the table in this way, this should be readily appreciated.

When the frequency is 2 GHz, switching element $41_1$ is taken to be non-conducting and switching element $41_2$ is conductively connected, and by connecting reactance element B $42_2$ which has a line length of $\lambda_{4G}/4$ to reactance element A 40 which has a line length of $\lambda_{4G}/8$, it is possible to make the sum of the admittances zero.

Even with the method of preparing line lengths corresponding to the base frequencies in this way and, in case the frequency changes, adding the difference in line length that needs to be increased, a bias circuit handling a plurality of frequencies can be implemented. By making a configuration in this way, it is possible to cut back the number of switches by one compared to FIG. 6A. Also, in the case of the embodiment shown in FIG. 7, a line length of $\lambda_{4G}/2$ can be saved compared to FIG. 6A. In return for this, it is possible to save board installation surface area.

Fifth Embodiment

Figure 8:
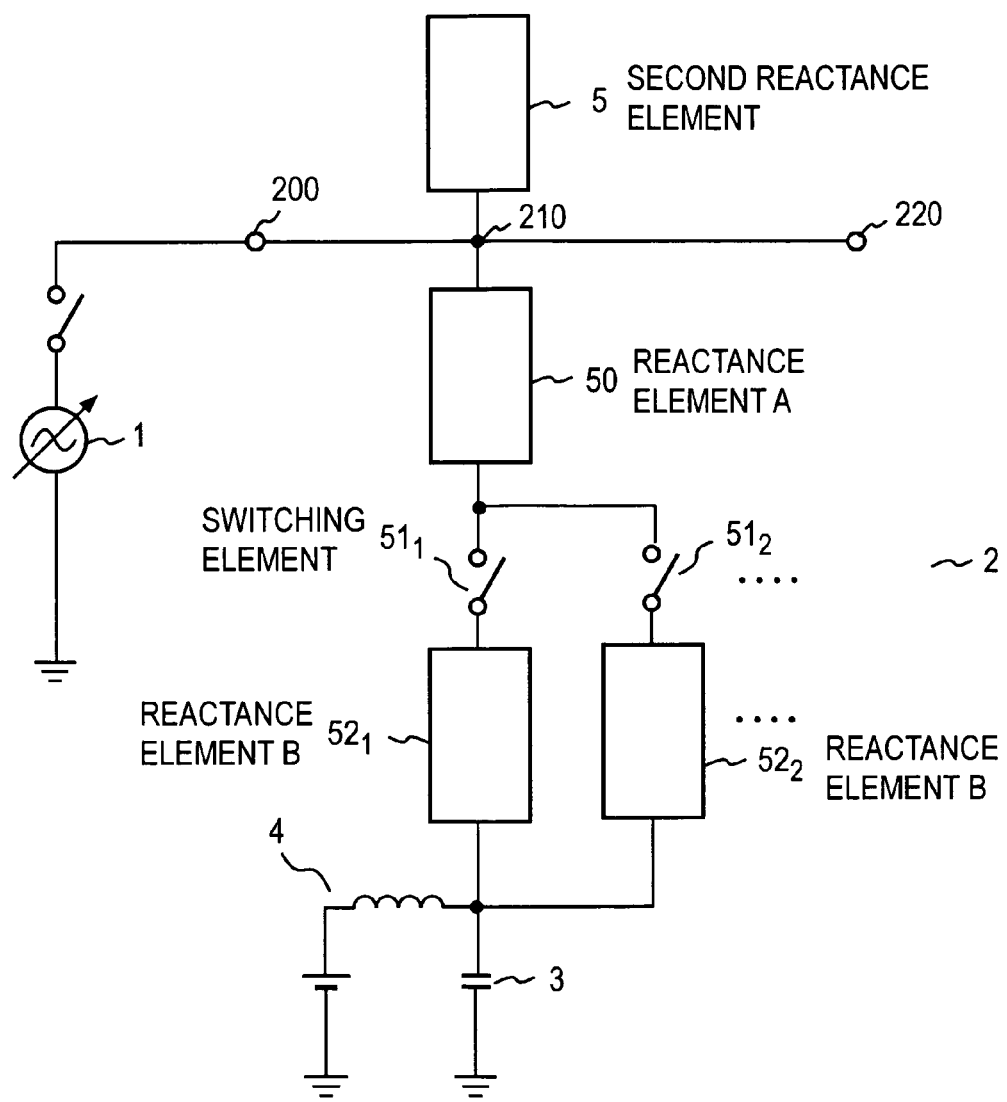
FIG. 8 is a diagram showing the fifth embodiment of this invention.

The fifth embodiment, which is shown in FIG. 8, is an example in which first reactance means 2 is constituted by a reactance element A 50 which is always connected to bias point 210, and a plurality of reactance elements B $52_1$, $52_2$, etc., connected via switching elements $51_1$, $51_2$ to this reactance element A 50.

The present embodiment differs from the fourth embodiment only in the point that the switched reactance means shows up on the side of first reactance means 2. As a result, first reactance means 2 is constituted by reactance element A 50, reactance elements B $52_1$, $52_2$, etc., and switching elements $51_1$, $51_2$ for connecting the same reactance elements B respectively to reactance element A 50. These reactance elements B $52_1$, $52_2$, etc., at the aforementioned used frequencies, make have a length of only the difference with respect to the line length of reactance element A 40. (Refer to Table 1.) However, regarding the embodiment of FIG. 8, there is always a need to provide an electric current path between bias point 210 and DC circuit 4, in order to switch first reactance means 2 which is a transmission line whose tip is short-circuited.

Sixth Embodiment

Figure 9:
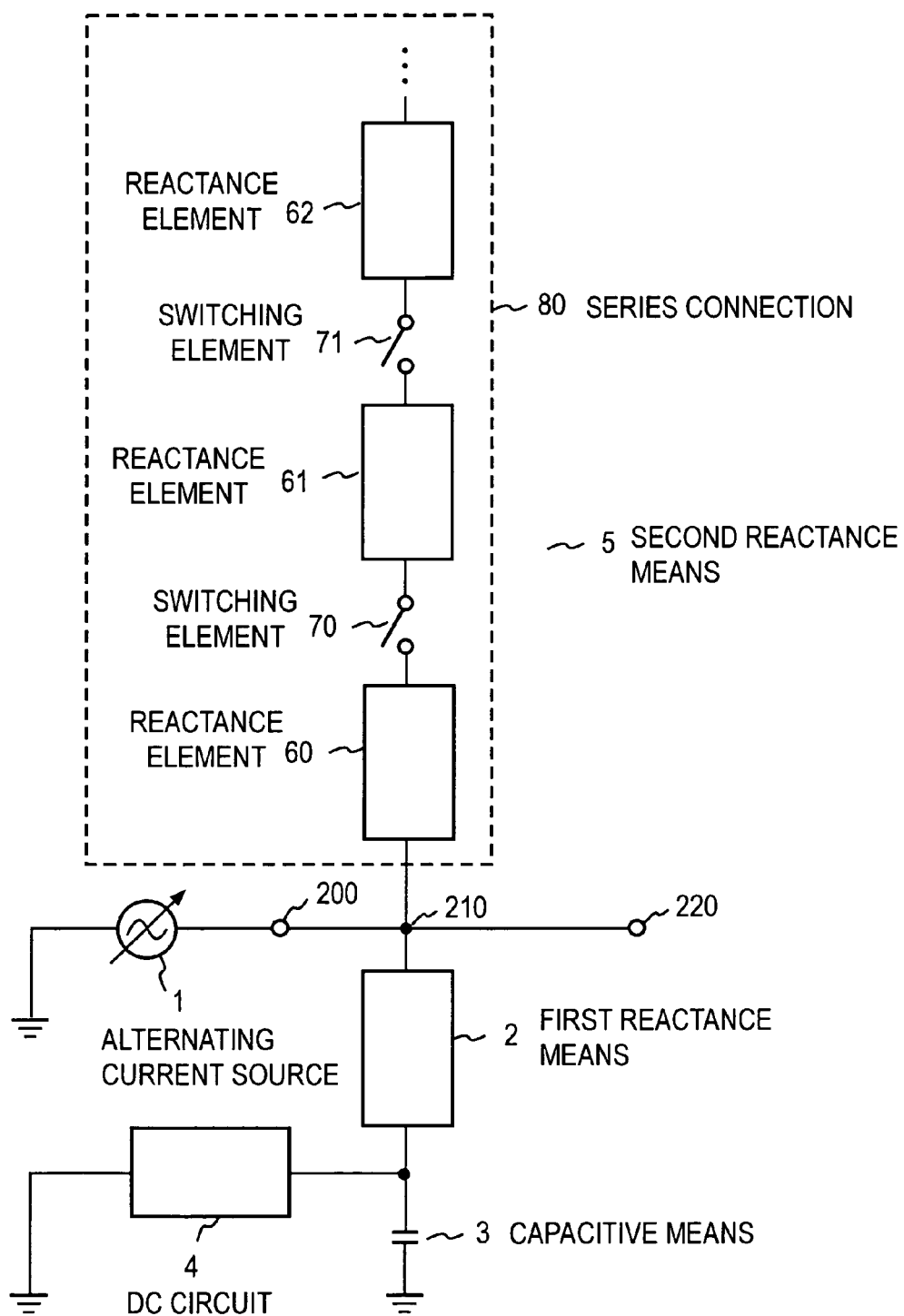
FIG. 9 is a diagram showing the sixth embodiment of this invention.

In FIG. 9, the sixth embodiment is shown. The second reactance means 5 of the present embodiment is a series connection 80 of reactance elements wherein a plurality of reactance elements 60, 61, etc., are connected consecutively via switching elements 70, 71, etc. One end of reactance element series connection 80 is connected to the aforementioned bias point 210. Other parts of the configuration are the same as in FIG. 6A.

One end of reactance element 60 with a line length of $\lambda_{4G}/8$ is always connected to bias point 210. When the AC frequency of AC signal is 4 GHz, the term $\beta_H L_1 + \beta_H L_2$ is chosen to be $\pi/2$ so the sum of the admittances becomes zero, by means of first reactance means 2, with a line length of $\lambda_{4G}/8$, and the $\lambda_{4G}/8$ line length reactance element 60 constituting second reactance means 5. At this point, switching element 70 is in a non-conducting state.

When the AC signal frequency of AC signal source 1 is 3 GHz, switching element 70 is conductively connected, so reactance element 61 with a line length of $\lambda_{4G}/12$ is connected to reactance element 60. At this point, the length of transmission line L2 constituting second reactance means 5 becomes $\lambda_{4G}/8 + \lambda_{4G}/12$.

In the present embodiment, as the frequency decreases from 4 GHz to 3 GHz, 2 GHz, and 1 GHz, switching elements 70, 71, etc., are conductively connected in order to add line length reactance elements 61, 62, etc. And then, the line length of second reactance means 5 as a whole is regulated to a length corresponding to each frequency. By connecting in series n-stage reactance elements 60, 61 in multiple stages in this way, it is possible to handle a number of frequencies.

Figure 10:
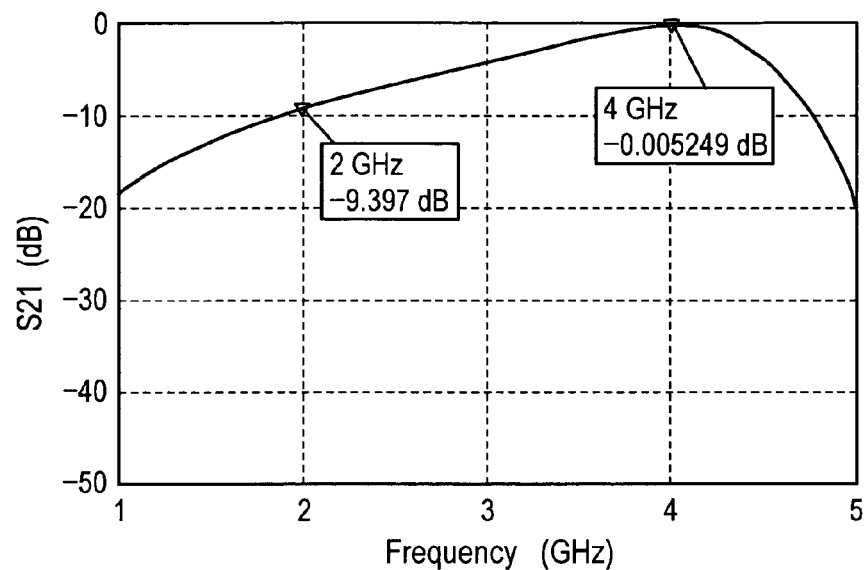
FIG. 10 is a diagram showing passing characteristics of the embodiment shown in FIG. 9.
Figure 11:
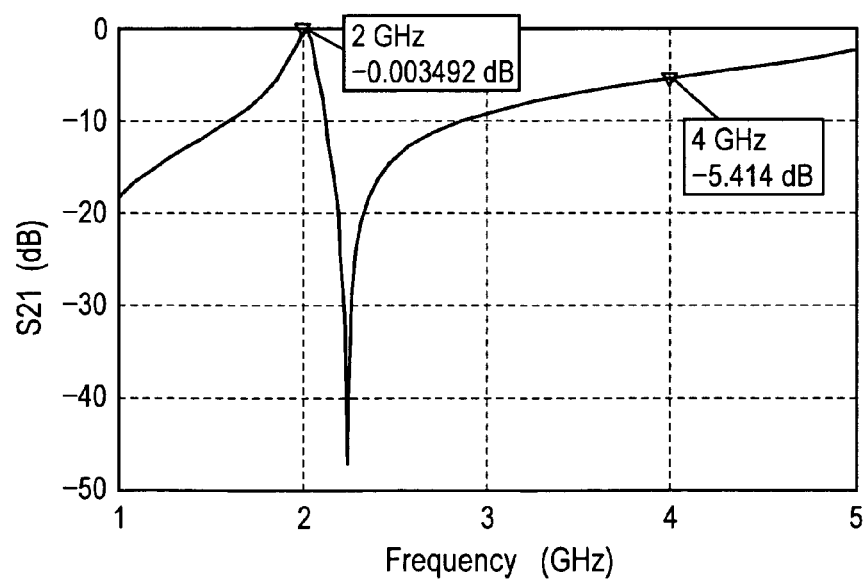
FIG. 11 is a diagram showing passing characteristics of the embodiment shown in FIG. 9.

In FIG. 10 and FIG. 11, there are shown the passing characteristics of the embodiment shown in FIG. 9. FIG. 10 shows the simulation results when switching elements 70, 71, etc., in FIG. 9 are all non-conducting, so the frequency at which the sum of the admittances becomes zero is chosen to be 4 GHz. The figure is a diagram in which the abscissa axis is the frequency and the ordinate axis is the gain expressed by the forward transfer factor S21 (in dB) of the S parameter. The S21 value at a frequency of 4 GHz is −0.005 dB, almost zero, so it is seen that the sum of the admittances of bias point 210 is regulated to zero. At this point, the transfer factor at a frequency of 3 GHz is −4 dB and the transfer factor at 2 GHz is approximately −9 dB.

FIG. 11 shows the simulation results when the two switching elements 70, 71 are conductively connected, so the frequency at which the sum of the admittances becomes zero is chosen to be 2 GHz. The abscissa axis and the ordinate axis are the same as in FIG. 10. In this way, it is seen that the sixth embodiment, shown in FIG. 9, can function as a bias circuit with respect to a frequency of 2 GHz.

Seventh Embodiment

Figure 12:
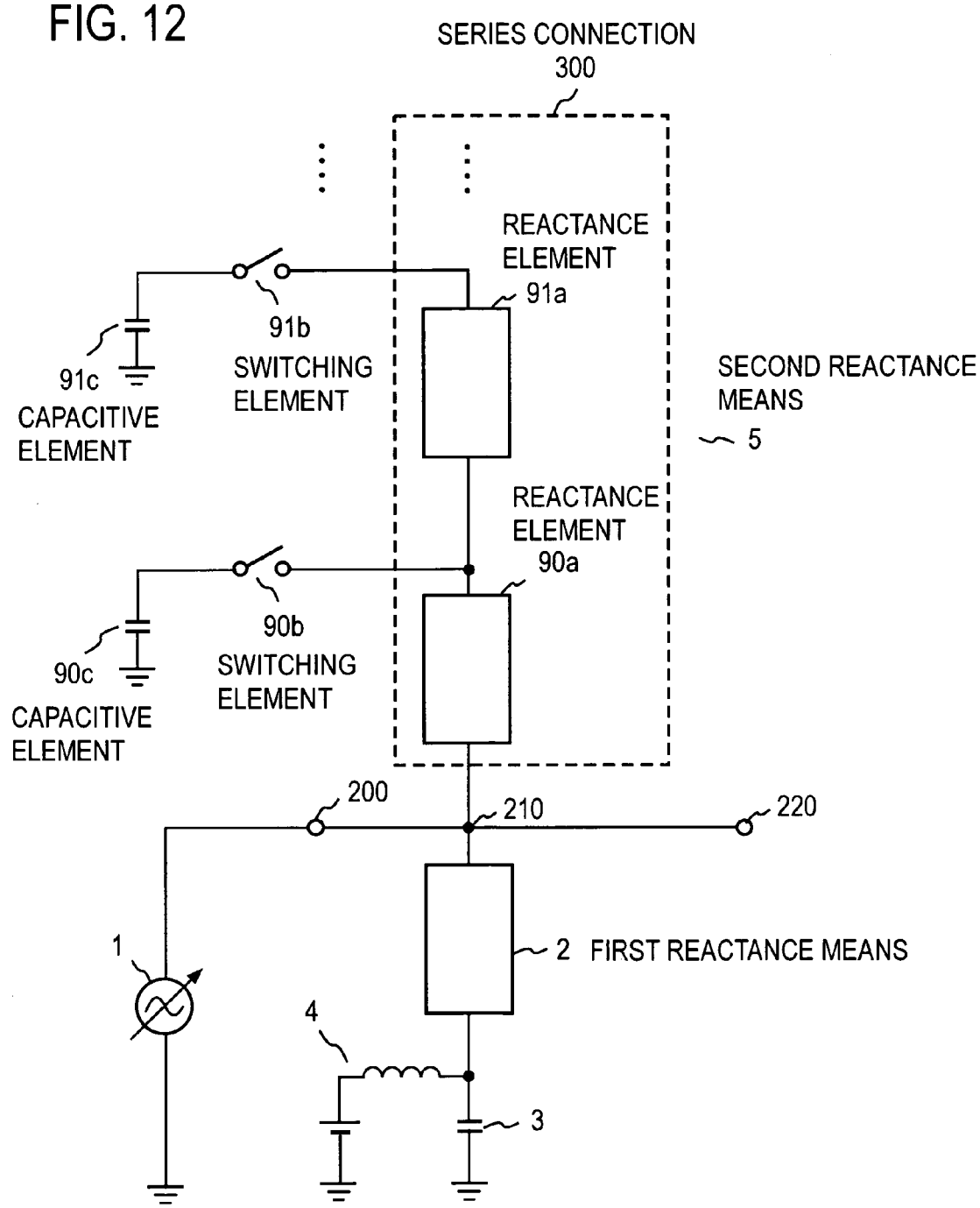
FIG. 12 is a diagram showing the seventh embodiment of this invention.

In FIG. 12, the configuration of the seventh embodiment is shown. The present embodiment is an example in which both first reactance means 2 and second reactance means 5 are taken to be lines whose tips are short-circuited. Second reactance means 5 is constituted by a serial connection 300, of a plurality of reactance elements 90a, 91a, etc., having one end connected to bias point 210; switching elements 90b, 91b, etc.; and capacitive elements 90c, 91c, etc. One end of each capacitive element 90c, 91c, etc., is connected, via the respective switching element 90b, 91b, etc., to the end of each reactance element 90a, 91a, etc., on the respective side facing away from the aforementioned bias point, the other ends of the capacitive elements being connected to ground.

One end of second-stage, as seen from bias point 210, reactance element 91a of second reactance means 5, is connected to the other end of reactance element 90a. In the same way, the nth-stage reactance element, not illustrated, is series connected in multiple stages. Portions other than this are the same as in FIG. 6A.

When the AC signal frequency of AC signal source 1 is 4 GHz, reactance element 90a functions as a line whose tip is short-circuited by the fact that switching element 90b is conducting and that the electrostatic capacitance of capacitive element 90c is chosen to be sufficiently large to be considered a short circuit AC-wise at 4 GHz. At this point, the second-stage reactance element 91a can be ignored, since the end of reactance element 90a on the side of reactance element 91a is short-circuited AC-wise by means of capacitive element 90c.

If first reactance means 2 is taken to be a transmission line with a line length of $\lambda_{4G}/4$ and reactance element 90a of second reactance means 5 is taken to be a $\lambda_{4G}/4$ transmission line, the term $\beta_H L_1 + \beta_H L_2$ becomes $\pi$ which satisfies the condition of Eq. 7, so the sum of the admittances of bias point 210 seen from AC signal source 1 becomes zero.

If the frequency becomes 3 GHz, the line lengths of both transmission lines appear relatively smaller as the wavelength $\lambda$ becomes longer and respectively become $3\lambda_{3G}/16$. The $\beta_H L_1 + \beta_H L_2$ for this line length is $6\pi/8$, so the condition of Eq. 7 is not satisfied. Accordingly, the circuit makes the combined length of reactance element 90a and reactance element 91a function as a line whose tip is short-circuited. For that reason, the switching element 91b making a connection to reactance element 91a is conductively connected, whereas the switching element 90b connected to reactance element 90a is chosen to be non-conducting. In order for the condition of Eq. 7 to be satisfied, the line length of the line whose tip is short-circuited, constituting second reactance means 5, may be extended. In the case where the frequency is 3 GHz, since the same length is $\pi-6\pi/8=2\pi/8$, a value of $2\lambda_{3G}/16$, i.e. $\lambda_{3G}/8$, may be taken for the line length of transmission line L1. Consequently, the transmission line length of the reactance element 91a, second-stage as viewing second reactance means 5 from bias point 210, is taken to be a length of $\lambda_{3G}/8$. By making the electrostatic capacitance value of capacitive element 91c connected to switching element 91b sufficiently large, second reactance means 5 operates as a line whose tip is short-circuited with the combined length of reactance element 90a and reactance element 91a.

Similarly, at a frequency of 2 GHz, the line length $\lambda_{4G}/4$ of first reactance means 2 can be considered as $\lambda_{2G}/8$. Also, the line length $5\lambda_{3G}/16$ of second reactance means 5 combining reactance element 90a and reactance element 91a can be considered as $5\lambda_{2G}/24$. With the transmission line left in this state, the equation becomes $\beta_H L_1 + \beta_H L_2 = 2\pi/3$, so the sum of the admittances does not become zero. Here, similarly to the aforementioned relationship, a not illustrated switching element 92b is conductively connected and switching element 91b which was conducting when the frequency was 3 GHz, is taken to be non-conducting. And then, in reactance element 92a, not illustrated in FIG. 12, the insufficient line length of $\lambda_{2G}/6$ is compensated. In other words, reactance element 92a is a transmission line with a line length of $\lambda_{2G}/6$.

Similarly, in order to handle a frequency of 1 GHz, the line length of a not illustrated reactance element 93a may be taken to be $\lambda_{1G}/4$. The aforementioned relationships are shown in Table 2.

TABLE 2

| | Frequency (GHz) | | | |
|---|---|---|---|---|
| | 4 | 3 | 2 | 1 |
| Transmission line L1 | $\lambda_{4G}/4$ | $3\lambda_{3G}/16$ | $\lambda_{2G}/8$ | $\lambda_{1G}/16$ |
| Transmission line L2 | $\lambda_{4G}/4$ | $5\lambda_{3G}/16$ | $9\lambda_{2G}/24$ | $7\lambda_{1G}/16$ |
| $\beta_H L_1 + \beta_H L_2$ | $\pi$ | $\pi$ | $\pi$ | $\pi$ |
| Line length that should be added to transmission line L2 | | $\lambda_{3G}/8$ | $\lambda_{2G}/6$ | $\lambda_{1G}/4$ |

In this way, both first reactance means 2 and second reactance means 5 may be constituted by lines whose tips are short-circuited.

Further, as is evident from Eq. 7, in case both first reactance means 2 and second reactance means 5 are constituted by lines whose tips are short-circuited, the sum of the admittances becomes zero for frequencies which are integral multiples of the reference frequency. Consequently, when the reference frequency is e.g. taken to be 4 GHz, there is the characteristic that the circuit can operate as a bias circuit with the same circuit configuration at integral-multiple frequencies such as 8 GHz, 12 GHz, etc.

E.g., for a frequency of 4 GHz, the respective $\lambda_{4G}/4$ line lengths, when perceived at a frequency of 8 GHz, can be considered as $\lambda_{8G}/2$, twice the length, so the equation becomes $\beta_H L_1 + \beta_H L_2 = 2\pi$ and the condition of Eq. 7 is satisfied.

The characteristic of being able to use the circuit as a bias circuit at this harmonic frequency is a characteristic which can be obtained even in the case where first reactance means 2 and second reactance means 5 are constituted as distributed-parameter elements by transmission lines. Of course, this invention can be implemented even if first reactance means 2 and second reactance means 5 are constituted by lumped-parameter elements. However, in that case, the characteristic that the same configuration can be used even for harmonic frequencies is lost.

Eighth Embodiment

Figure 13:
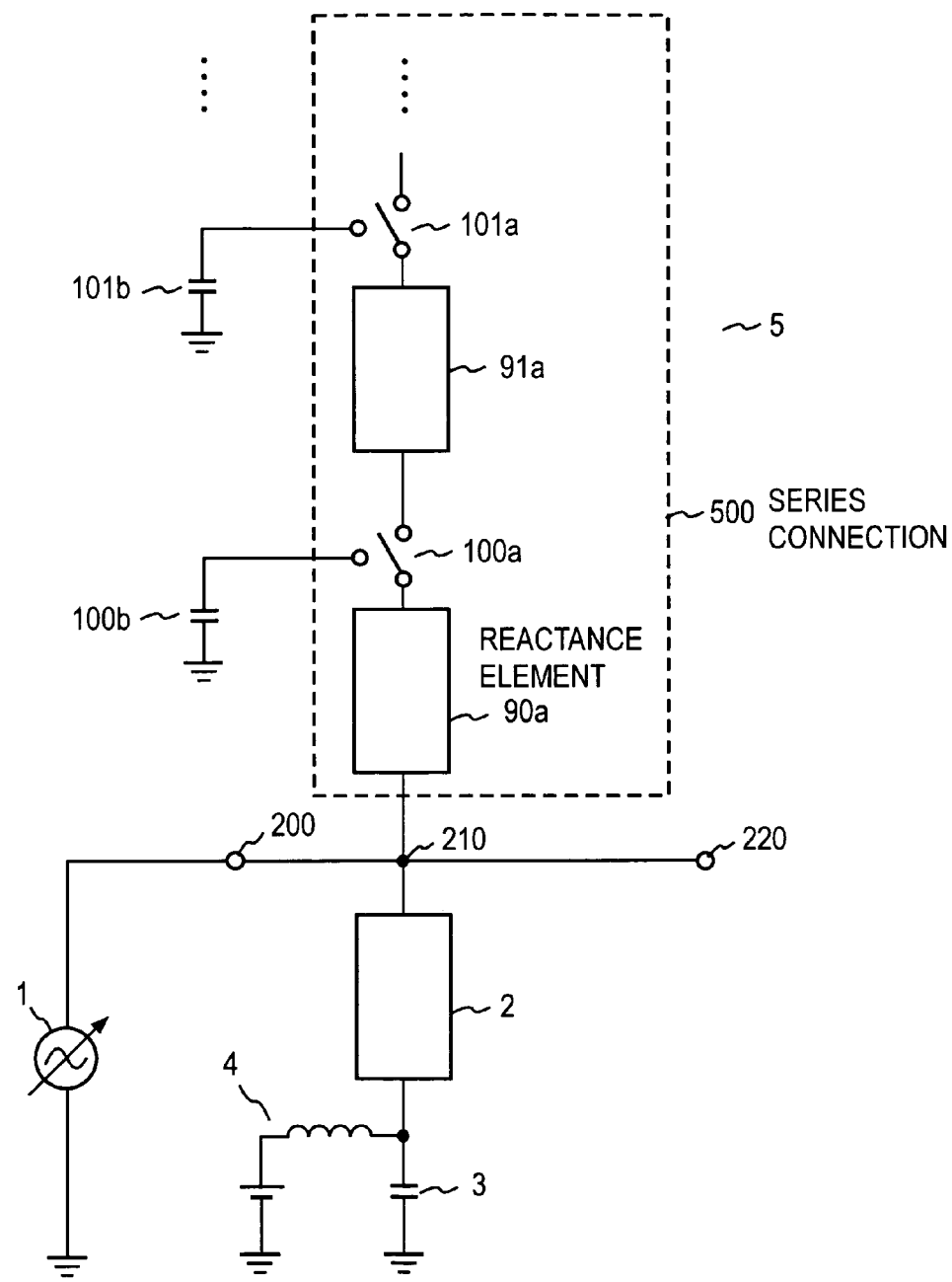
FIG. 13 is a diagram showing the eighth embodiment of this invention.

In FIG. 13, there is shown an example in which the switching elements 90b, 91b, etc., explained in FIG. 12, are constituted by Single Pole Double Throw switches (hereinafter referred to as SPDT switches).

The second reactance means 5 of the present embodiment is constituted by a series connection 500 in which a plurality of reactance elements 90a, 91a, etc., are connected consecutively via Single Pole Double Throw switching elements 100a, 101a, etc., and capacitive elements 100b, 101b, etc. One end of each capacitive element 100b, 101b, etc., is connected to that throw terminal of each respective SPDT element 100a, 101a, etc., which is different from the throw terminal to which the respective reactance element is connected, the other ends being connected to ground. The electrostatic capacitance of capacitive element 100b is smaller than that of capacitive element 90c explained in FIG. 12. The rest of the configuration is the same as in FIG. 12.

By constituting the switching elements by SPDT switches 100a, 101a in this way, it becomes possible to completely remove any influence of the reactance elements connected in multiple stages. In FIG. 12, since the switching elements were constituted by Single Pole Single Throw switches, it was necessary, for the electrostatic capacitance of the capacitive elements connected by means of switching elements, to set comparatively large values, sufficient to consider the capacitive elements as short-circuited AC-wise at the used frequencies. As against that, since, in FIG. 13, switching element 100a is an SPDT switch, it is possible, in the case of toggling switching element 100a to the side of electrostatic capacitance element 100b, to completely exclude the influence of, as seen from bias point 210, second and higher stage reactance elements 91a, 92a, etc. As a result, the need to choose larger values for the electrostatic capacitance of capacitive elements 100b, 101b, etc., disappears, so there is a wider degree of freedom in the design.

In the embodiment of FIG. 12, the configuration was one where capacitive elements 90c, 91c are capacitors for AC connection to ground and the electrostatic capacitance values thereof do not contribute to the determination of the frequency characteristics of the bias circuit. To make up for that, it was necessary to increase the value of the electrostatic capacitance of capacitive elements 90b, 91b. In the embodiment shown in FIG. 13, the working of capacitive elements 100b, 101b differs in that it is possible for the values thereof to exert an influence on the setting of the frequency characteristics of the bias circuit. In other words, the admittance $Y_1$, determined by first reactance means 2, and the admittance $Y_2$, determined by the reactance elements and capacitive elements determining the reactance value of second reactance means 5, may be designed including the reactance values of capacitive elements 100b, 101b so that $Y_1(f_H) + Y_2(f_H) = 0$ at an arbitrary frequency $f_H$. In return, it is possible to increase the degree of freedom in the design.

Switching Element Example

Here, a specific example of a switching element will be explained. The switching elements used in the embodiment of FIG. 13 can be readily implemented, even with a combination of semiconductor devices such as pin diodes. In addition, it is possible to also make an implementation with mechanical switches using MEMS (Micro Electromechanical Systems) technology which is provided with excellent isolation characteristics and very low insertion loss characteristics.

Figure 14A:
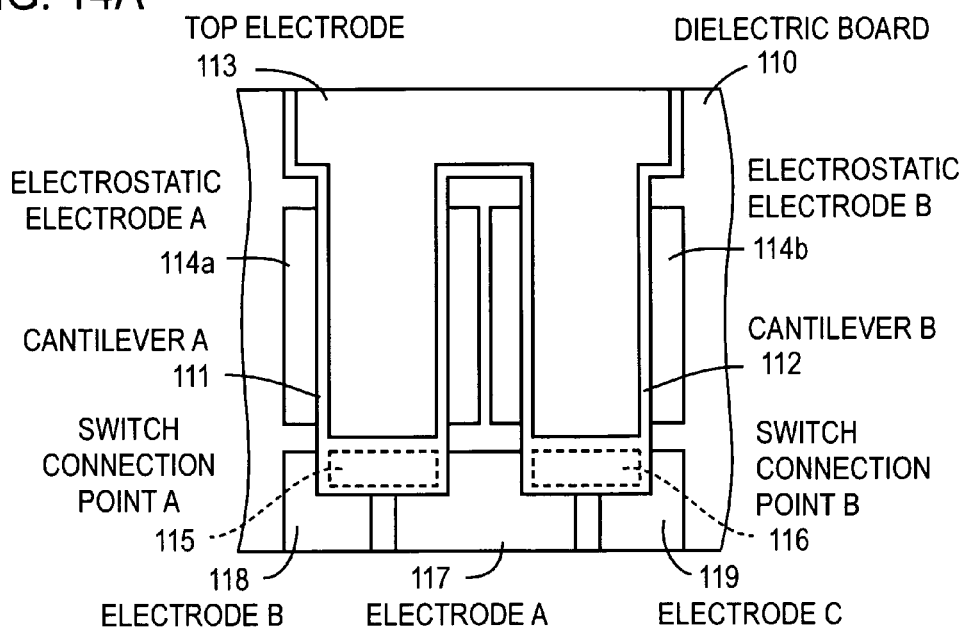
FIG. 14A is a plan view in the case where an SPDT switch is constituted by using MEMS technology.
Figure 14B:
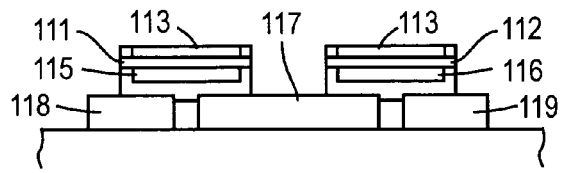
FIG. 14B is a front elevational view of a state in which the SPDT switch is non-conducting.
Figure 14C:
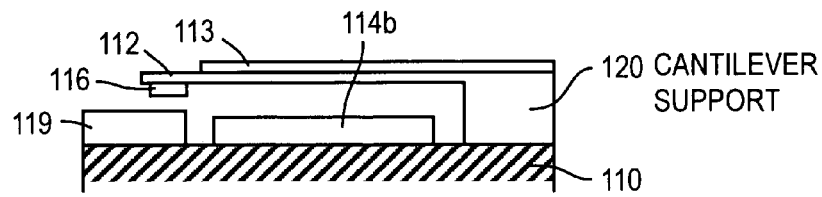
FIG. 14C is a side elevational view of a state in which the SPDT switch is non-conducting.

Hereinafter, an example will be explained in which the SPDT switches are implemented with MEMS switches. FIG. 14A is a plan view of the case where an SPDT switch is constituted by using MEMS technology. FIG. 14B is a front elevational view with the SPDT switch in a non-conducting state, and FIG. 14C is a side elevational view with the SPDT switch in a non-conducting state.

This switch is of a type called the cantilever type. A cantilever A 111 is disposed on the top part of a cantilever support 120 formed integrally with a dielectric board 110 and nearly in parallel with dielectric board 110. A cantilever B 112 is disposed side by side with cantilever A 111. Cantilever A 111 and cantilever B 112 serve as the mobile parts of the switch. Cantilevers A 111, B 112 are made by manufacturing methods using semiconductor processes. The material is silicon dioxide or the like. On the top face of cantilever A 111 and cantilever B 112, a top electrode 113 having one face is formed. On top of dielectric board 110, an electrostatic electrode A 114a and an electrostatic electrode B 114b are formed. The part of top electrode 113 on top of cantilever A 111 faces electrostatic electrode A 114a. Also, the part of top electrode 113 on top of cantilever B 112 faces electrostatic electrode B 114b.

On the dielectric board 110 side of the tip of cantilever A 111, there is formed a switch contact point A 115. Similarly, on the dielectric board 110 side of the tip of cantilever B 112, there is also formed a switch contact point B 116. Directly below switch contact point A 115, an electrode A 117, serving as the single pole of the SPDT switch, and an electrode B 118, serving as one terminal on the double throw terminal side, are disposed. Directly below switch contact point B 116, electrode A 117 and an electrode C 119, serving as the other double throw terminal, are disposed. Top electrode 113, electrostatic electrode A 114a, electrostatic electrode B 114b, electrode A 117, electrode B 118, and electrode C 119 are devised so that electrical signals from the outside can be added through not illustrated wiring connection holes (hereinafter referred to as via holes) formed respectively inside dielectric board 110.

When no voltage is impressed on top electrode 113 from the outside through a via hole, cantilever A 111 and cantilever B 112 maintain, by their own elastic force, a horizontal position with respect to dielectric board 110. This situation is shown in FIG. 14C. As shown in FIG. 14C, there is a gap between switch contact point B 116 and electrode C 119, so there is a state of non-conduction between electrode C 119 and electrode A 117. In FIG. 14C, although it is not apparent because it is hidden, the cantilever A 111 side is in the same state, so electrode A 117 and electrode B 118 are in a non-conducting state.

Figure 14D:
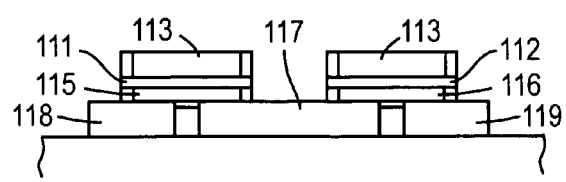
FIG. 14D is a front elevational view of a state in which the SPDT switch is conducting.
Figure 14E:
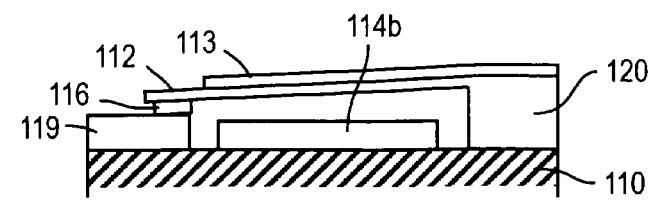
FIG. 14E is a side elevational view of a state in which the SPDT switch is conducting.

If a voltage is impressed between top electrode 113 and electrostatic electrode A 114a and between top electrode 113 and electrostatic electrode B 114b, a Coulomb force is generated between the electrodes in both cases, so cantilever A 111 and cantilever B 112 are deflected toward the dielectric board 110 side. When cantilever A 111 is deflected by the Coulomb force, contact point A 115 conductively connects electrode A 117 and electrode B 118. Similarly, contact point B 116 on the tip of cantilever B 112 conductively connects electrode A 117 and electrode C 119. This situation is shown in FIG. 14D and FIG. 14E.

An explanation has been given wherein two contact points on the double throw terminal side are simultaneously put in a conductively connected state, but in case the MEMS switch shown in FIG. 14 is used as an SPDT switch, control may be performed by adding a voltage on either electrostatic electrode A 114a or electrostatic electrode B 114b, one at a time.

Ninth Embodiment

Figure 15:
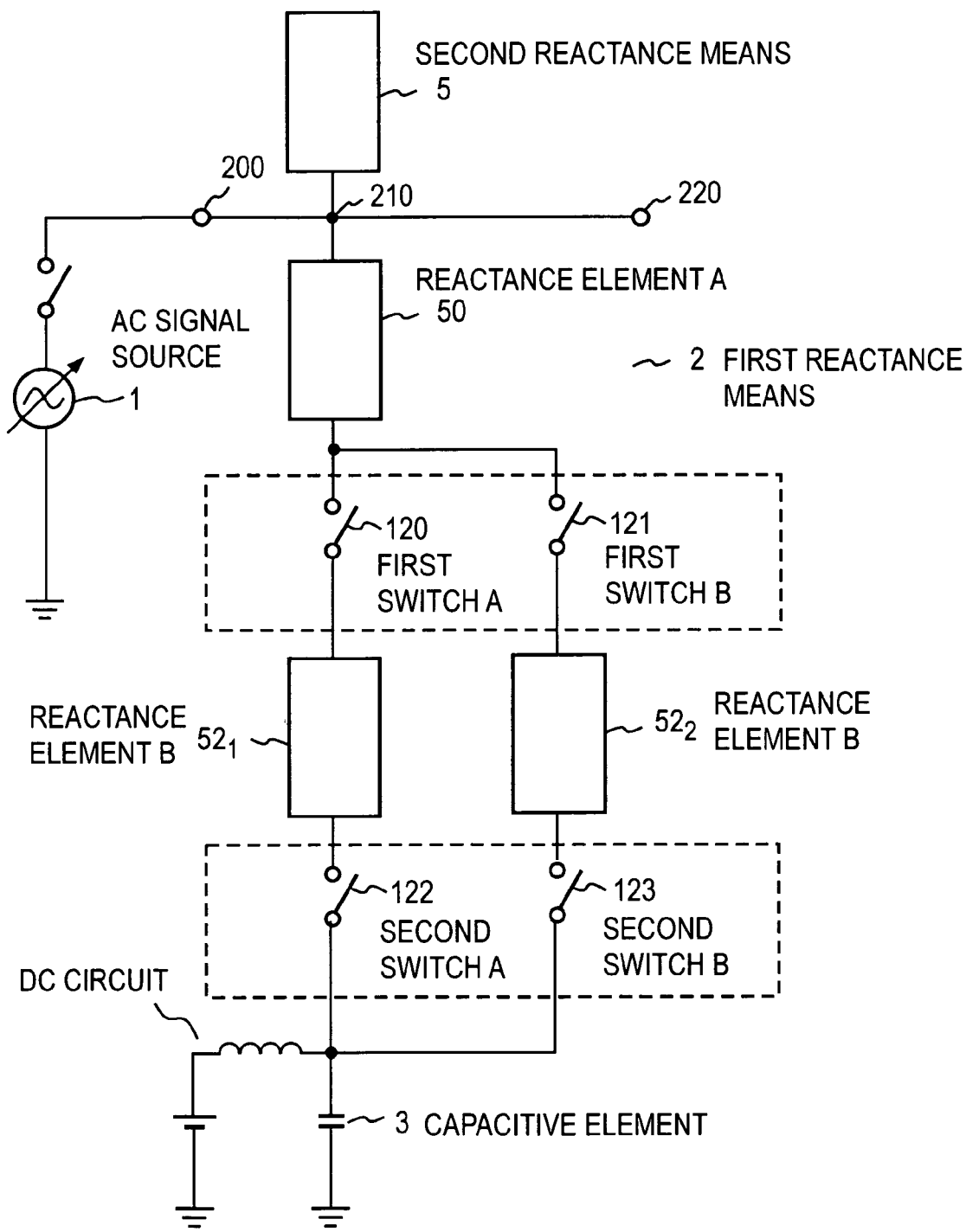
FIG. 15 is a diagram showing the ninth embodiment of this invention.

In FIG. 15, there is shown the configuration of an embodiment devised to switch both terminals of the plurality of reactance elements B $52_1$, $52_2$ explained in the fifth embodiment (FIG. 8).

One end of reactance element A 50 is connected to bias point 210, the other end being connected to a first switching element A 120 and a first switching element B 121. The other ends of first switching element A 120 and first switching element B 121 are respectively connected to one end of reactance element B $52_1$ and one end of reactance element B $52_2$. The other ends of reactance element B $52_1$ and reactance element B $52_2$ are respectively connected to one end of a second switching element A 122 and one end of a second switching element B 123. The other ends of second switching element A 122 and second switching element B 123 are connected to ground via capacitive element 3. In this way, the only point which differs from FIG. 8 is that switching elements are arranged at both terminals of reactance element $52_1$ and reactance element $52_2$.

In case the circuit of FIG. 15 operates as a bias circuit handling some specific frequency, the elements of one of the pair of first switching element A 120 and second switching element A 122, both connected to the same reactance element B $52_1$, and the pair of first switching element B 121 and second switching element B 123, both connected to reactance element B $52_2$, are simultaneously conducting.

At this point, by the use of a first switching element and a second switching element, both in a non-conducting state, it is possible to obtain the two kinds of results mentioned below. For the first, e.g. the pair of first switching element A 120 and second switching element A 122 is taken to be in a conducting state. Also, the line length of reactance element B $52_2$ corresponding to the same frequency is chosen to have a length of a quarter of a wavelength. If, in this state, second switching element B 123 is conductively connected and first switching element B 121 is taken to be non-conducting, it is possible to strengthen AC connection to ground, due to capacitive element 3. Reactance element B $52_2$, serving as a line whose tip is open-circuited, becomes a short circuit at the corresponding frequency at a point a quarter-wavelength from the point where the tip is open-circuited, looking at it AC-wise. In other words, by the fact that second switching element B 123 is conductively connected, the result is equivalent to a new, large electrostatic capacitance with one end connected to ground being connected in parallel with capacitive element 3.

One more result is that it becomes possible, in the aforementioned state, to finely regulate the frequency characteristics of the bias circuit, if first switching element B 121 is put in a conducting state and second switching element B 123 is taken to be non-conducting. By connecting reactance element B $52_2$, which is a line whose tip is open-circuited, in parallel with reactance element B $52_1$ operating as a transmission line whose tip is short-circuited, it is possible to regulate the condition at which the admittance becomes zero. Since specific examples would fall in the category of design matters, they will be omitted here.

By providing switching elements at both terminals of reactance element B $52_1$ and reactance element B $52_2$ in this way, it is possible to obtain results which differ from those in the embodiments explained so far. Further, an explanation was given with an example with two reactance elements and two each of the first and second switching elements, but it does not matter if there are respectively two or more.

Tenth Embodiment

Figure 16A:
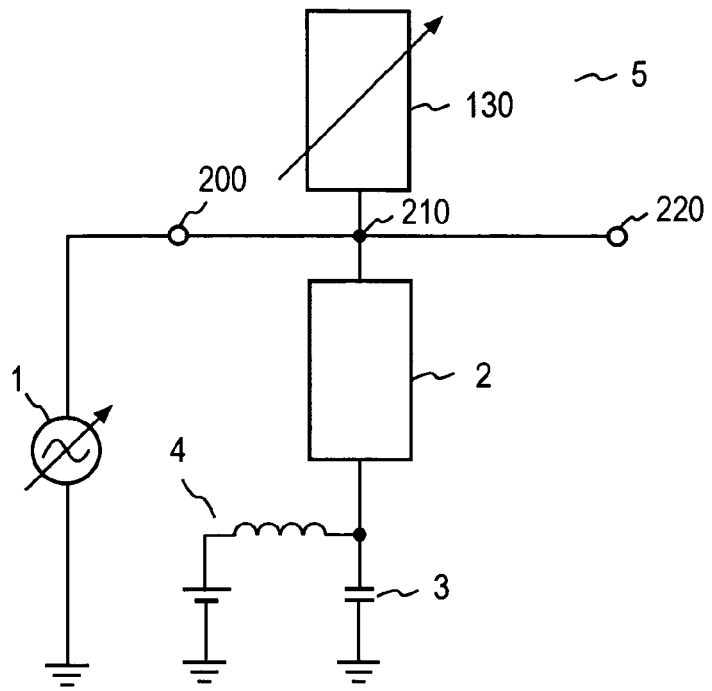
FIG. 16A is a diagram showing the tenth embodiment of this invention.

FIG. 16A is an example in which second reactance means 5 of FIG. 2 is constituted by a variable-reactance element 130, a lumped-parameter element. The rest of the configuration is the same as in FIG. 2. In case it is attempted to constitute this variable-reactance element 130 by a dielectric reactance, it is possible to use a variable inductor or the like. Specifically, there are variable inductors using MEMS technology. Also, it is possible as well to constitute the variable-reactance element by a capacitive reactance. As a capacitive element, there is a variable-capacitance element using a reverse biased depletion layer of a semiconductor pn junction.

By constituting second reactance means 5 by these variable reactance elements, the frequency at which the sum of the admittances with first reactance means 2 becomes zero can be readily modified.

Eleventh Embodiment

Figure 16B:
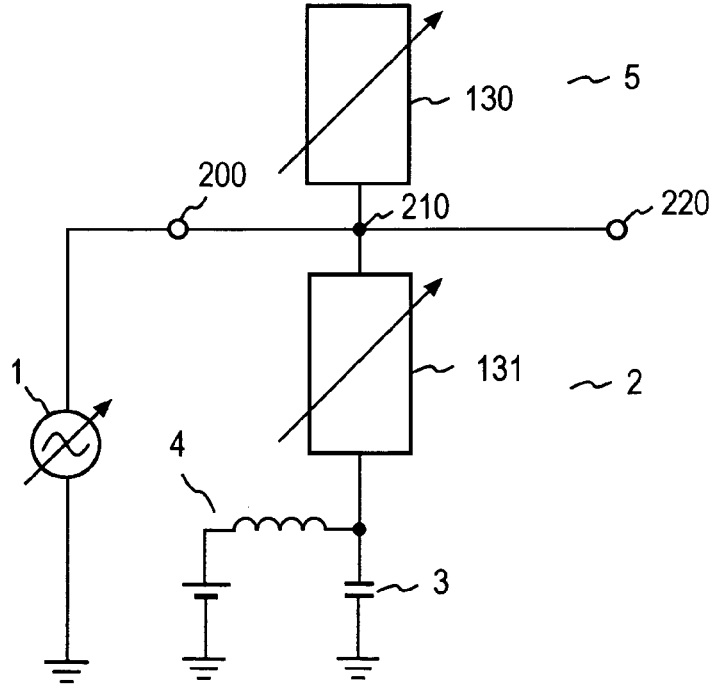
FIG. 16B is a diagram showing the eleventh embodiment of this invention.

FIG. 16B is an example wherein first reactance means 2 is also constituted by a variable-reactance element to widen the range of variation of the frequency. It only differs from FIG. 16A in the point that first reactance element 2, which was fixed in FIG. 16A, has become a variable-reactance element 131. By constituting first reactance means 2 and second reactance means 5 as variable-reactance elements described above, the range in which the reactance can be varied is widened. Consequently, the range of frequencies in which the sum of the admittances can be made zero is widened. However, since it is necessary for first reactance means 2 to pass direct currents, it is not possible to constitute it by a capacitive reactance alone. In other words, there is a need to use at least one element conductively connecting direct currents from the DC circuit to the bias point.

Twelfth Embodiment

Figure 17A:
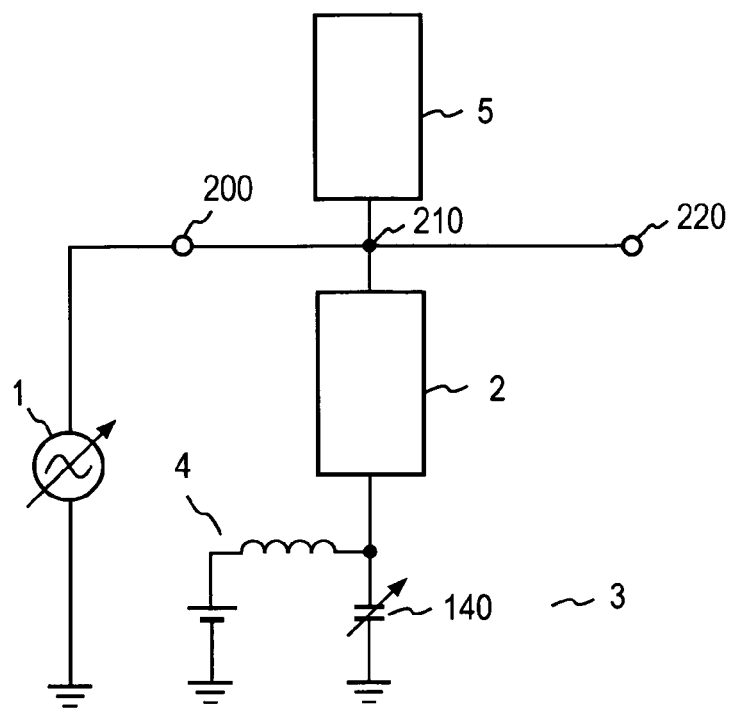
FIG. 17A is a diagram showing the twelfth embodiment of this invention, using a variable-capacitance element.

In FIG. 17A, there is shown an embodiment in which the thinking on a bias circuit including the reactance of the capacitive element explained in the seventh embodiment has been further developed.

FIG. 17A differs from FIG. 2 used in the explanation of the basic principles of this invention in that capacitive element 3 is not a capacitive element for grounding, connecting the other end of first reactance means 2 AC-wise to ground, but is a variable-capacitance element 140 with a comparatively small electrostatic capacitance value. The rest of the configuration is the same.

As a variable-capacitance element 140, a variable-capacitance element using the aforementioned reverse-biased depletion layer of a semiconductor pn junction can be utilized. By connecting the other end of first reactance means 2 to variable-capacitance element 140 in this way, the admittance $Y_1$ of first reactance means 2 can be varied. Consequently, by varying the value of variable-capacitance element 140, the sum of the admittance $Y_1(f_H)$ and the admittance $Y_2(f_H)$ of second reactance means 5 for an arbitrary frequency $f_H$ can be made zero.

Even if a variable-capacitance element is provided at the other end, not illustrated, of second reactance means 5, the frequency can be regulated in the same way.

Figure 17B:
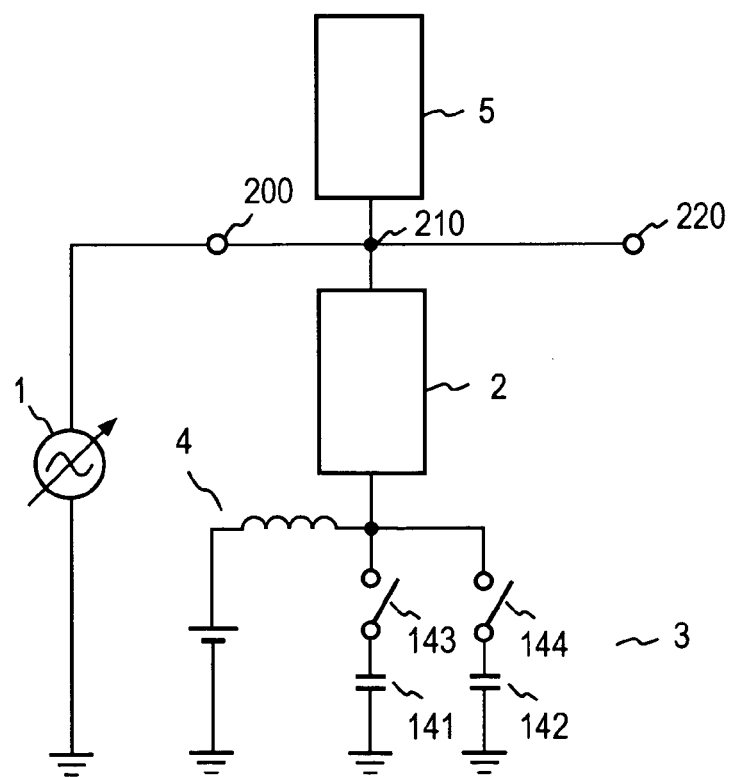
FIG. 17B is a diagram showing the twelfth embodiment of this invention, selectively using several types of capacitance elements.

The embodiment shown in FIG. 17B is an example wherein variable-capacitance element 140 of FIG. 17A is constituted by capacitive elements 141 and 142 having fixed electrostatic capacitance values and constituted so that the respective capacitive elements 141, 142 are selectively connected to the other end of first reactance means 2 by means of switching elements 143 and 144. The rest of the configuration is the same as in FIG. 17A. In the example of FIG. 17B, since capacitive elements 141, 142 having fixed capacitance values are selectively connected, the frequency characteristics do not change continuously but become discrete.

Application Example

Figure 18:
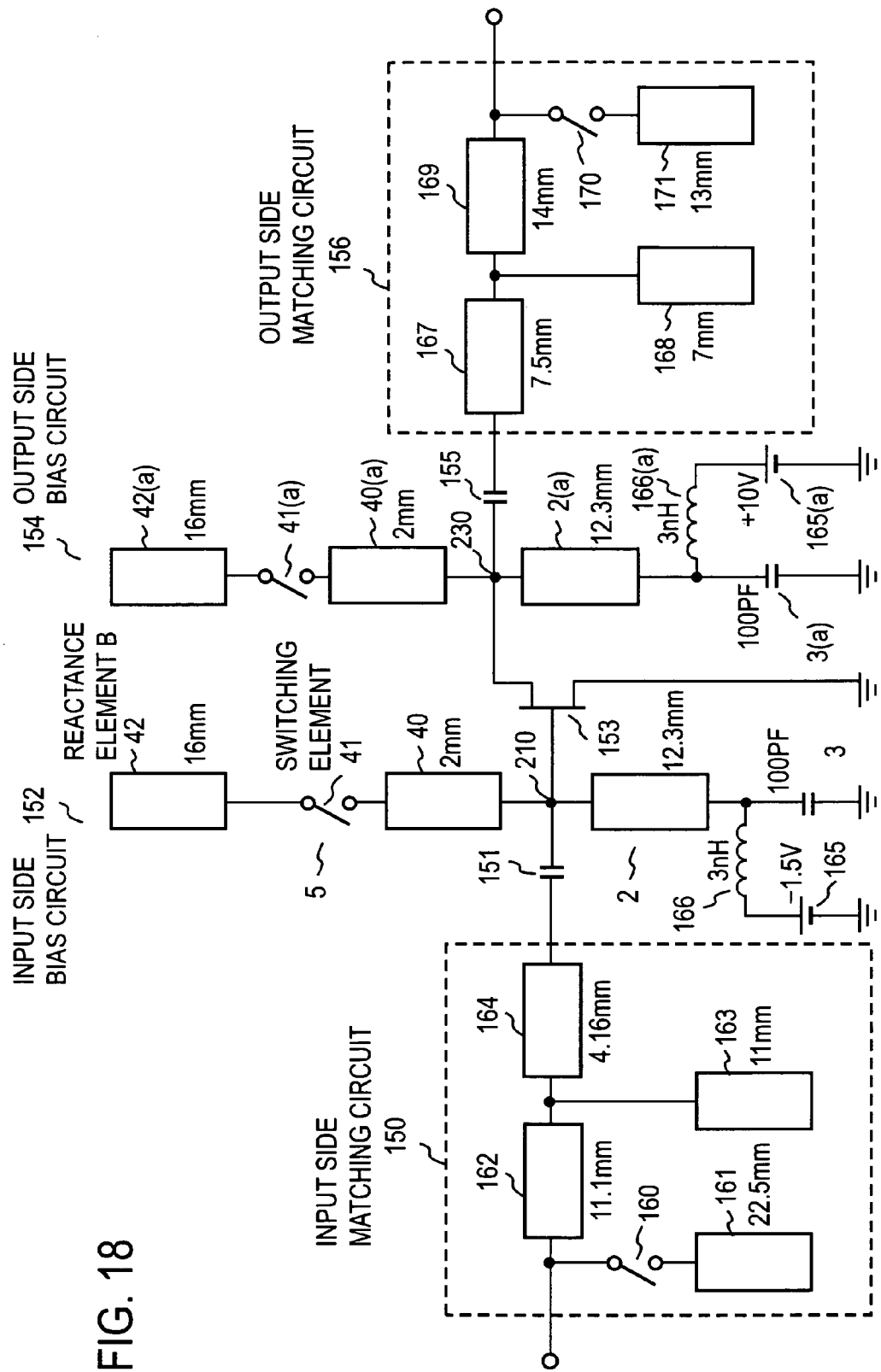
FIG. 18 is a diagram showing one example of an application example of a bias circuit of this invention.

An example will be given in which the aforementioned bias circuit is applied. FIG. 18 shows an example of the bias circuit in the second embodiment (FIG. 6A) applied to a power amplifying circuit.

A not illustrated AC signal source is connected to one end of an input side matching circuit 150. To the output end of input side matching circuit 150, a DC cut capacitor 151 is connected. The other end of DC cut capacitor 151 is connected to bias point 210 of an input side bias circuit 152. Input side bias circuit 152 consists of first reactance means 2 and second reactance means 5. Bias point 210 is connected to the gate electrode of an FET 153. The source electrode of FET 153 is connected to ground, and the drain electrode of FET 153 is connected to an output side bias point 230 of an output-side bias circuit 154. One end of an output side DC cut capacitor 155 is connected to output side bias point 230. The other end of output side DC cut capacitor 155 is connected to one end of an output side matching circuit 156. The other end of output side matching circuit 156 is connected to a not illustrated switching circuit switching the transmission and reception linked to an antenna.

Taking FET 153 as the center, an active element carrying out power amplification, bias circuits 152 and 154, DC cut capacitors 151 and 155, and matching circuits 150 and 156 are connected so that the input side and the output side have a symmetric relationship. The power amplifying circuit shown in FIG. 18 shows an example designed to operate at two AC signal frequencies, 1 GHz and 2 GHz. Consequently, matching circuits 150, 156 and bias circuits 152, 154 are constituted so that the operating frequency is switched by means of switching elements.

Input side matching circuit 150 is constituted by a switching element 160, a line 161 with a line length of 22.5 mm whose tip is open-circuited, a transmission line 162 with a line length of 11.1 mm, a line 163 with a line length of 11 mm whose tip is open-circuited, and a transmission line 164 with a line length of 4.16 mm. One end of switching element 160 is connected to a terminal to which an AC signal source is connected, the other end being connected to one end of line 161 whose tip is open-circuited. The other end of line 161 whose tip is open-circuited is left open. One end of transmission line 162 is connected to a terminal to which the AC signal source is connected, one end of line 163 whose tip is open-circuited and one end of transmission line 164 being connected to the other end thereof. The other end of line 163 whose tip is open-circuited is left open. The other end of transmission line 164 is connected to one end of DC cut capacitor 151.

Further, the line width of the transmission lines constituting matching circuits 150, 156 and bias circuits 152, 154 is set to a width for which the characteristic impedance is 50 Ω.

Input side bias circuit 152 has the same configuration as in FIG. 6. First reactance means 2 is constituted by a transmission line with a line length of 12.3 mm. The electrostatic capacitance value of capacitive element 3 is 100 pF, DC circuit 4 being constituted by a DC power supply 165 generating a voltage of −1.5 V with respect to the ground potential and a choke coil 166. Second reactance means 5 constituting input side bias circuit 152 is constituted by a reactance element A 40 which is a transmission line with a line length of 2 mm, a switching element 41, one end of which connects the other end of reactance element A 40, and a reactance element B 42 formed by a line with a line length of 16 mm whose tip is open-circuited, connected to the other end of switching element 41.

The configuration of output side bias circuit 154 is exactly the same as that of input side bias circuit 152, with the exception of the bias voltage. Consequently, the numbers of the reference numerals are taken to be the same but are expressed with an "(a)" appended to the number. However, the number 230 is attached to the bias point. Further, DC power source 165(a) of output side bias circuit 154 is set to +10 V with respect to the ground potential.

Output side matching circuit 156 is constituted by a transmission line 167 with a line length of 7.5 mm, a line 168 with a line length of 7 mm whose tip is open-circuited, a transmission line 169 with a line length of 14 mm, a switching element 170, and a line 171 with a line length of 13 mm whose tip is open-circuited. One end of transmission line 167 is connected to output side DC cut capacitor 155, one end of line 168 whose tip is open-circuited and one end of transmission line 169 being connected to the other end thereof. The other end of line 168 whose tip is open-circuited is left open. The other end of transmission line 169 is connected to one end of switching element 170. Also, the other end of transmission line 169 is connected to the output terminal of output side matching circuit 156. The other end of switching element 170 is connected to line 171 whose tip is open-circuited. The other end of line 171 whose tip is open-circuited is left open.

When the frequency of the signal supplied from the AC signal source is 1 GHz, switching elements 160, 41, 41(a), and 170 are all conductively connected. When the frequency is 2 GHz, they are all non-conducting.

Figure 19A:
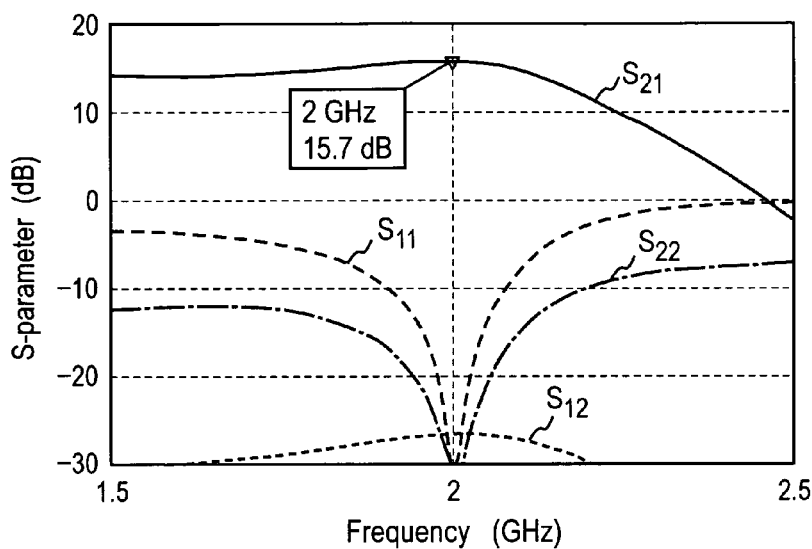
FIG. 19A is a diagram showing characteristics of the application example shown in FIG. 18.
Figure 19B:
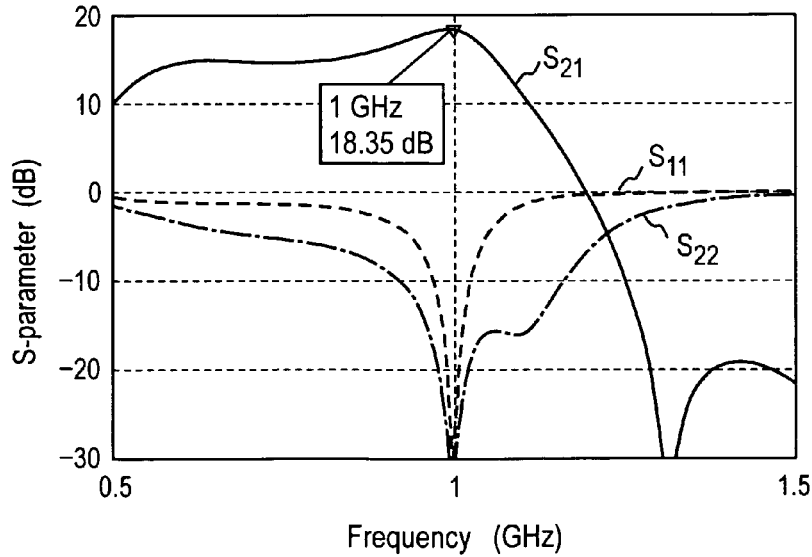
FIG. 19B is a diagram showing characteristics of the application example shown in FIG. 18.

The simulation results of the transfer factors between the input and the output of the power amplifying circuit of the aforementioned configuration are shown in FIG. 19A and FIG. 19B. The transfer factors when switching elements 160, 41, 41(a), and 170 are all taken to be non-conducting, for a frequency of 2 GHz, are shown in FIG. 19A. The abscissa axis of FIG. 19A is the frequency (in GHz) and the ordinate axis is the S parameter (in dB) of each transfer factor. The forward transfer factor S21 expressing the amplification factor of the amplifying circuit shows a nearly flat characteristic up to 1.5 GHz-2 GHz. The frequency at which S21 has declined by 3 dB is roughly 2.2 GHz. The input side reflection factor S11 and the output side reflection factor S22 decline abruptly at 2 GHz. Also, the transfer factor S12 in the reverse direction, seen from the output side toward the input side, also shows a small value of approximately −27 dB at 2 GHz. In this way, the circuit has frequency characteristics which are sufficient for an amplifying circuit for the 2 GHz frequency band.

The transfer factors when switching elements 160, 41, 41(a), and 170 are all taken to be conducting, for a frequency of 1 GHz, are shown in FIG. 19B. The abscissa axis and the ordinate axis of FIG. 19B are the same as in FIG. 19A. From the forward transfer factor S21, it is seen that the frequency band in which the circuit can serve as an amplifying circuit is ensured in approximately the 0.84 GHz to 1.06 GHz range. The input side reflection factor S11 and the output side reflection factor S22 decline abruptly at 1 GHz. The reverse transfer factor S12, seen from the output to the input side, also has a value which is so small that it cannot be illustrated in FIG. 19B. Consequently, the circuit has frequency characteristics which are sufficient for an amplifying circuit for the 1 GHz frequency band.

As mentioned above, by applying the bias circuit of this invention to a power amplifying circuit, it is possible to implement a bias circuit with a simple configuration which handles a plurality of frequencies. Further, in the application example shown in FIG. 18, a voltage-controlled FET was used for the active element, but it is also possible to use a current-controlled bipolar transistor.

In the application example shown in FIG. 18, a bias circuit that can also handle the 1 GHz band could be implemented by just adding two switching components 41, 41(a) and two reactance components B 42, 42(a) to the bias circuit for the 2 GHz band.

In the method of preparing the conventional bias circuit shown in FIG. 1, the elements constituting one bias circuit are four passive elements and one active element. Since the passive elements are situated both on the input side and the output side, the number of components is 4×2+1, the result being nine components. In other words, in order to add one frequency band, nine components must be added. As against this, for the bias circuit according to this invention, it becomes possible to attain the same object with an addition of four components, as mentioned above. In this way, if a conversion to multiband capability is undertaken with the bias circuit of this invention, a major effect can be obtained in terms of space and cost.

Also, if a comparison is made with the method of changing the matching conditions shown in Document 2, in the case of this invention, by a design for making the admittance of the bias circuit zero, a design detached from that of a matching circuit is possible. Consequently, conjunctively with the space and cost effects, there can also be obtained the effect that a bias circuit with high reliability can be provided, due to the effect of not choosing devices (particularly active elements) and because a clear design is possible.

What is claimed is:

1. A bias circuit comprising:
   a connection point adapted to receive an alternating current signal;
   a first reactance means one end of which is connected to said connection point;
   a capacitive means one end of which is connected to the other end of said first reactance means and the other end of which is connected to ground, and
   a direct current circuit supplying a DC voltage to the connection between said first reactance means and said capacitive means;
   a second reactance means one end of which is connected to said connection point at the one end of said first reactance means; and
   a regulating means for regulating the reactance value of at least one of said first reactance means, said second reactance means, and said capacitive means, wherein
   the respective reactance values on the side of said first reactance means and said second reactance means, and of said capacitive means, are set so that the total admittance, seen from the connection point of said first reactance means and said second reactance means, becomes zero and the connection point is connected to supply the received alternating current signal and a received bias voltage to a radio frequency amplifying element.

2. The bias circuit according to claim 1, wherein a second capacitive means, one end of which is connected to ground, is connected to the other end of said second reactance means.

3. The bias circuit according to claim 1, wherein said second reactance means includes a plurality of reactance elements as well as a plurality of switching elements which are respectively connected between said bias point and said plurality of reactance elements.

4. The bias circuit according to claim 1, wherein said first reactance means includes
   a plurality of switching elements, one end each of which is connected to said bias point; and
   a plurality of reactance elements respectively connected to the respective other ends of said switching elements.

5. The bias circuit according to claim 1, wherein
   said second reactance means includes
   a reactance element A, one end of which is connected to said bias point; and a plurality of reactance elements B one end each of which is connected via respective switching elements to the other end of said reactance element A.

6. The bias circuit according to claim 1, wherein
   said first reactance means includes
   a reactance element A, one end of which is connected to said bias point; and a plurality of reactance elements B one end each of which is connected via a respective switching element to the other end of said reactance element A.

7. The bias circuit according to claim 1, wherein
   said second reactance means is a series connection of reactance elements, in which a plurality of reactance elements are connected consecutively via switching elements, one end of the series connection being connected to said bias point.

8. The bias circuit according to claim 1, wherein said second reactance means includes
   said series connection of a plurality of reactance elements, one end of the series connection being connected to said bias point; and
   capacitive elements, one end each of which is respectively connected via a switching element to the end of said respective reactance element on the side facing away from said bias point, and the other ends of which are connected to ground.

9. The bias circuit according to claim 1, wherein said second reactance means includes
a series connection in which a plurality of reactance elements are connected consecutively via Single Pole Double Throw switches; and
capacitance elements one end each of which is connected to a throw terminal of said respective Single Pole Double Throw switch element which differs from the throw terminal to which a reactance element is connected and the other ends of which are connected to ground.

10. The bias circuit according to claim 1, wherein said first reactance means includes
a reactance element A, one end of which is connected to said bias point;
a plurality of reactance elements B, one end each of which is connected respectively via one of a plurality of first switching elements respectively connected to the other end of said reactance element A; and
second switching elements, one end each of which is respectively connected to the other end of one of said reactance elements B.

11. The bias circuit according to claim 1, wherein said second reactance means is constituted by a variable-reactance element.

12. The bias circuit according to claim 1, wherein said first reactance means and said second reactance means are constituted by variable-reactance elements.

13. The bias circuit according to claim 1, wherein said capacitive means is a variable-capacitance element.

* * * * *